US012563873B2

(12) United States Patent
Kim

(10) Patent No.: US 12,563,873 B2
(45) Date of Patent: Feb. 24, 2026

(54) DISPLAY DEVICE AND MANUFACTURING METHOD THEREOF

(71) Applicant: Samsung Display Co., LTD., Yongin-si (KR)

(72) Inventor: Si Kwang Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 856 days.

(21) Appl. No.: 17/854,525

(22) Filed: Jun. 30, 2022

(65) Prior Publication Data

US 2023/0121816 A1     Apr. 20, 2023

(30) Foreign Application Priority Data

Oct. 20, 2021     (KR) ......................... 10-2021-0140535

(51) Int. Cl.
| | |
|---|---|
| *H10H 20/831* | (2025.01) |
| *H10H 20/01* | (2025.01) |
| *H10H 20/84* | (2025.01) |
| *H10H 20/851* | (2025.01) |
| *H10H 20/857* | (2025.01) |

(52) U.S. Cl.
CPC ........ *H10H 20/8312* (2025.01); *H10H 20/01* (2025.01); *H10H 20/84* (2025.01); *H10H 20/8514* (2025.01); *H10H 20/857* (2025.01); *H10H 20/032* (2025.01); *H10H 20/034* (2025.01); *H10H 20/0361* (2025.01); *H10H 20/0364* (2025.01)

(58) Field of Classification Search
CPC ........... H10H 20/8312; H10H 20/8514; H10H 20/0184; H10H 20/857; H10H 20/034; H10H 20/0364; H10H 20/0361; H10H 20/032
See application file for complete search history.

(56) References Cited

U.S. PATENT DOCUMENTS

| | | | | |
|---|---|---|---|---|
| 12,074,264 | B2 * | 8/2024 | Kim ..................... | H10H 20/853 |
| 12,080,693 | B2 * | 9/2024 | Lee ..................... | H01L 25/0753 |
| 12,100,710 | B2 * | 9/2024 | Kang .................. | H01L 25/0753 |

(Continued)

FOREIGN PATENT DOCUMENTS

| | | |
|---|---|---|
| KR | 10-2020-0034896 A | 4/2020 |
| KR | 10-2021-0027564 | 3/2021 |
| KR | 10-2021-0029337 A | 3/2021 |

*Primary Examiner* — Mary Ellen Bowman
(74) *Attorney, Agent, or Firm* — Womble Bond Dickinson (US) LLP

(57) ABSTRACT

A display device includes a pixel disposed in a display area of a substrate and including an emission area and a non-emission area. The pixel includes a light emitting element disposed in the emission area and including a first end and a second end facing each other in an extending direction, a first pixel electrode electrically connected to the first end of the light emitting element, a second pixel electrode electrically connected to the second end of the light emitting element, an insulating pattern disposed on the light emitting element to expose the first and second ends and including a first surface contacting the light emitting element, and a second surface facing the first surface in a thickness direction of the substrate, and a coating layer disposed on the first and second pixel electrodes and including a flat surface. The coating layer does not contact the insulating pattern.

20 Claims, 24 Drawing Sheets

(56)  References Cited

U.S. PATENT DOCUMENTS

| | | | | |
|---|---|---|---|---|
| 12,100,728 | B2 * | 9/2024 | Kwag | H10D 86/60 |
| 12,100,784 | B2 * | 9/2024 | Choi | H10D 86/451 |
| 12,155,018 | B2 * | 11/2024 | Do | H10H 20/8514 |
| 12,159,958 | B2 * | 12/2024 | Kim | H10H 20/8316 |
| 12,166,017 | B2 * | 12/2024 | Lim | H10H 20/857 |
| 12,166,064 | B2 * | 12/2024 | Lee | H10H 20/84 |
| 12,166,157 | B2 * | 12/2024 | Moon | H10H 29/142 |
| 12,183,857 | B2 * | 12/2024 | Kim | H10H 29/34 |
| 12,191,424 | B2 * | 1/2025 | Lee | H10H 20/8316 |
| 12,199,216 | B2 * | 1/2025 | Lee | H10H 20/84 |
| 12,230,745 | B2 * | 2/2025 | Park | H01L 25/0753 |
| 12,255,223 | B2 | 3/2025 | Im et al. | |
| 12,272,769 | B2 * | 4/2025 | Lee | H01L 25/0753 |
| 12,324,312 | B2 | 6/2025 | Kim et al. | |
| 2018/0175009 | A1 * | 6/2018 | Kim | H01L 25/0753 |
| 2021/0066561 | A1 * | 3/2021 | Chang | H10D 86/40 |
| 2021/0280753 | A1 * | 9/2021 | Kim | H10H 20/01 |
| 2022/0011487 | A1 * | 1/2022 | Park | G09G 3/035 |
| 2022/0059739 | A1 * | 2/2022 | Li | H01L 25/167 |

* cited by examiner

BNKP: BNKP1, BNKP2
ALE: ALE1, ALE2
PE: PE1, PE2
OP: OP1, OP2
MAP: MAP1, MAP2

LCP: CCL, CF
DAM: BNK, D_BNK

T { DE
GE
ACT
SE

LCP: CCL, CF
DAM: BNK, D_BNK

LCP: CCL, CF
DAM: BNK, D_BNK

LCP: CCL, CF
LBP: LBP1, LBP2

1

DISPLAY DEVICE AND MANUFACTURING METHOD THEREOF

CROSS-REFERENCE TO RELATED APPLICATION(S)

The application claims priority to and benefits of Korean Patent Application No. 10-2021-0140535 under 35 U.S.C. § 119, filed in the Korean Intellectual Property Office on Oct. 20, 2021, the entire contents of which are incorporated herein by reference.

BACKGROUND

1. Technical Field

The disclosure relates to a display device and a manufacturing method thereof.

2. Description of Related Art

Recently, as interest in an information display is increasing, research and development for display devices is continuously conducted.

SUMMARY

The disclosure has been made in an effort to provide a display device and a manufacturing method thereof that may improve reliability.

In addition, the disclosure has been made in an effort to provide a display device and a manufacturing method thereof that may have a relatively simple manufacturing process by reducing the number of masks and may reduce manufacturing costs.

An embodiment of the disclosure provides a display device. The display device may include a pixel disposed in a display area of a substrate and including an emission area and a non-emission area. The pixel may include a light emitting element disposed in the emission area and including a first end and a second end facing each other in an extending direction of the light emitting element, a first pixel electrode electrically connected to the first end of the light emitting element, a second pixel electrode electrically connected to the second end of the light emitting element, an insulating pattern disposed on the light emitting element to expose the first and second ends, the insulating pattern including a first surface contacting the light emitting element, and a second surface facing the first surface in a thickness direction of the substrate, and a coating layer disposed on the first and second pixel electrodes and including a flat surface. The coating layer may not contact the insulating pattern.

The coating layer may include an organic film.

The coating layer may include at least one of acryl, polyimide, and siloxane.

Each of the first and second pixel electrodes may contact a side surface of the insulating pattern.

A surface of the coating layer and at least one area of each of the first and second pixel electrodes may be colinear.

The first pixel electrode and the second pixel electrode may be provided on a same layer, the first pixel electrode and the second pixel electrode may include a same material, and the first pixel electrode and the second pixel electrode may be spaced apart from each other on the insulating pattern.

The coating layer may be positioned in the emission area.

The pixel may be positioned on the second surface of the insulating pattern, and the pixel may further include a first pattern contacting the second surface of the insulating pattern.

The first pattern may not contact the coating layer.

The insulating pattern may be surrounded by the first pattern, the first and second pixel electrodes, and the light emitting element.

The pixel may include a bank that is positioned in the non-emission area and includes a first opening corresponding to the emission area, and a second opening spaced apart from the first opening, and a second pattern disposed on the bank.

The first pattern and the second pattern may include a same material.

The pixel may further include a light conversion pattern positioned on the coating layer to correspond to the emission area, and a light blocking pattern positioned on the bank in the non-emission area.

The light conversion pattern may include a color conversion layer positioned on the coating layer and converting light of a first color emitted from the light emitting element into light of a second color, and a color filter positioned on the color conversion layer to correspond to the color conversion layer.

The coating layer may be disposed between the light emitting element and the color conversion layer in a thickness direction of the substrate.

The pixel may further include a pixel circuit layer including at least one transistor and at least one power wire electrically connected to the light emitting element, a first bank pattern and a second bank pattern that are disposed on the pixel circuit layer and spaced apart from each other at least in the emission area, a first alignment electrode positioned on the first bank pattern and electrically connected to the transistor, and a second alignment electrode positioned on the second bank pattern and electrically connected to the power wire.

Another embodiment of the disclosure provides a display device that may include a pixel disposed in a display area of a substrate and including an emission area and a non-emission area. The pixel may include at least one transistor and at least one power wire that are disposed on the substrate, a via layer disposed on the transistor and the power wire, a first alignment electrode and a second alignment electrode that are disposed on the via layer and spaced apart from each other, an insulating layer disposed on the first and second alignment electrodes, a light emitting element disposed on the insulating layer between the first alignment electrode and the second alignment electrode and including a first end and a second end in an extending direction, an insulating pattern positioned at an upper portion of the light emitting element, a first pixel electrode electrically connected to the first electrode and the first end of the light emitting element, a second pixel electrode electrically connected to the second electrode and the second end of the light emitting element, a coating layer positioned on the first and second pixel electrodes and having a flat surface, and a color conversion layer disposed on the coating layer and in the emission area to correspond to the light emitting element. The coating layer may not contact the insulating pattern and includes an organic film.

Another embodiment of the disclosure provides a manufacturing method of a display device. The method may include forming at least one pixel including an emission area and a non-emission area on a substrate. The forming of the at least one pixel may include forming a first alignment electrode and a second alignment electrode that are spaced apart from each other on the substrate, forming a first insulating layer on the first and second alignment electrodes, forming a bank on the first insulating layer to correspond to the non-emission area, aligning a light emitting element on the first insulating layer between the first alignment electrode and the second alignment electrode, sequentially applying a first material layer and a second material layer on the light emitting element, performing a photolithography process using a first mask to remove a portion of the second material layer to form a first pattern corresponding to the light emitting element and a second pattern corresponding to the bank, and partially exposing the first material layer, performing a dry ashing process using the first and second patterns as a second mask to remove the exposed first material layer, and forming a second insulating layer positioned under the first and second patterns, coating a conductive layer on the first and second patterns and the first insulating layer, and coating a third material layer on the conductive layer, performing a photolithography process using a third mask to remove a portion of the third material layer to form a coating layer, and exposing a portion of the conductive layer, and removing a portion of the exposed conductive layer to form a first pixel electrode and a second pixel electrode that are spaced apart from each other, and exposing the first pattern on the second insulating layer.

The coating layer may include at least one of acryl, polyimide, and siloxane.

The forming of the at least one pixel may further include, after the forming of the first pixel electrode and the second pixel electrode, forming a color conversion layer at an upper portion of the coating layer.

According to an embodiment of the disclosure, it may be possible to provide a display device and a manufacturing method thereof that may have a relatively simple manufacturing process while reducing the manufacturing cost by reducing the number of masks by forming a first pixel electrode and a second pixel electrode in the same process.

According to an embodiment of the disclosure, by disposing a coating layer between a light emitting element and a color conversion layer to minimize transmission of heat generated from the light emitting element to the color conversion layer to prevent deterioration of the color conversion layer, it may be possible to improve reliability of the color conversion layer.

According to an embodiment of the disclosure, it may be possible to provide a display device having improved light output efficiency and a manufacturing method thereof.

An effect according to an embodiment of the disclosure is not limited by what is illustrated in the above, and other various effects are included in the specification.

4

Figure 5:
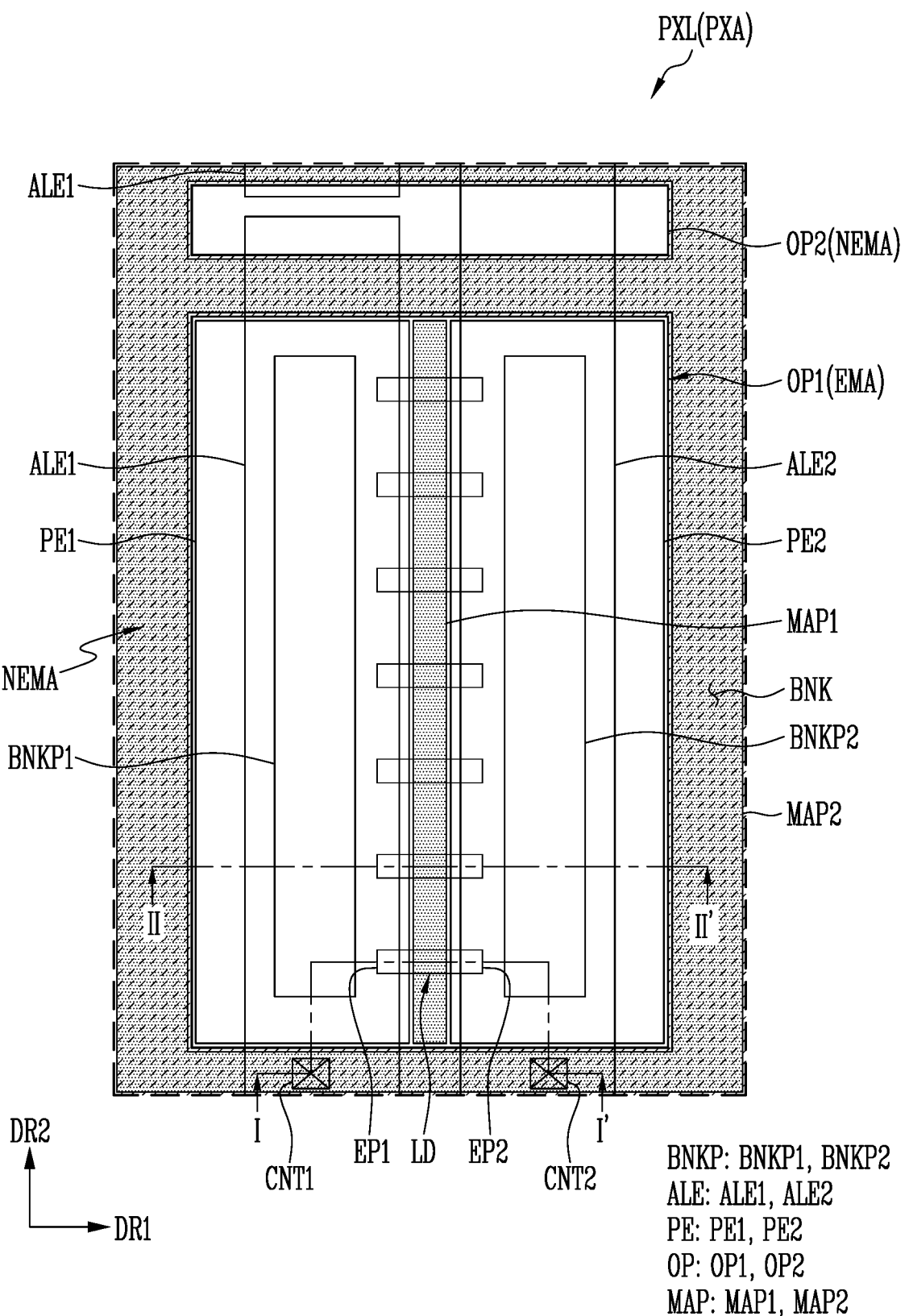
FIG. 5 illustrates a schematic top plan view of a pixel illustrated in FIG. 3.
Figure 6:
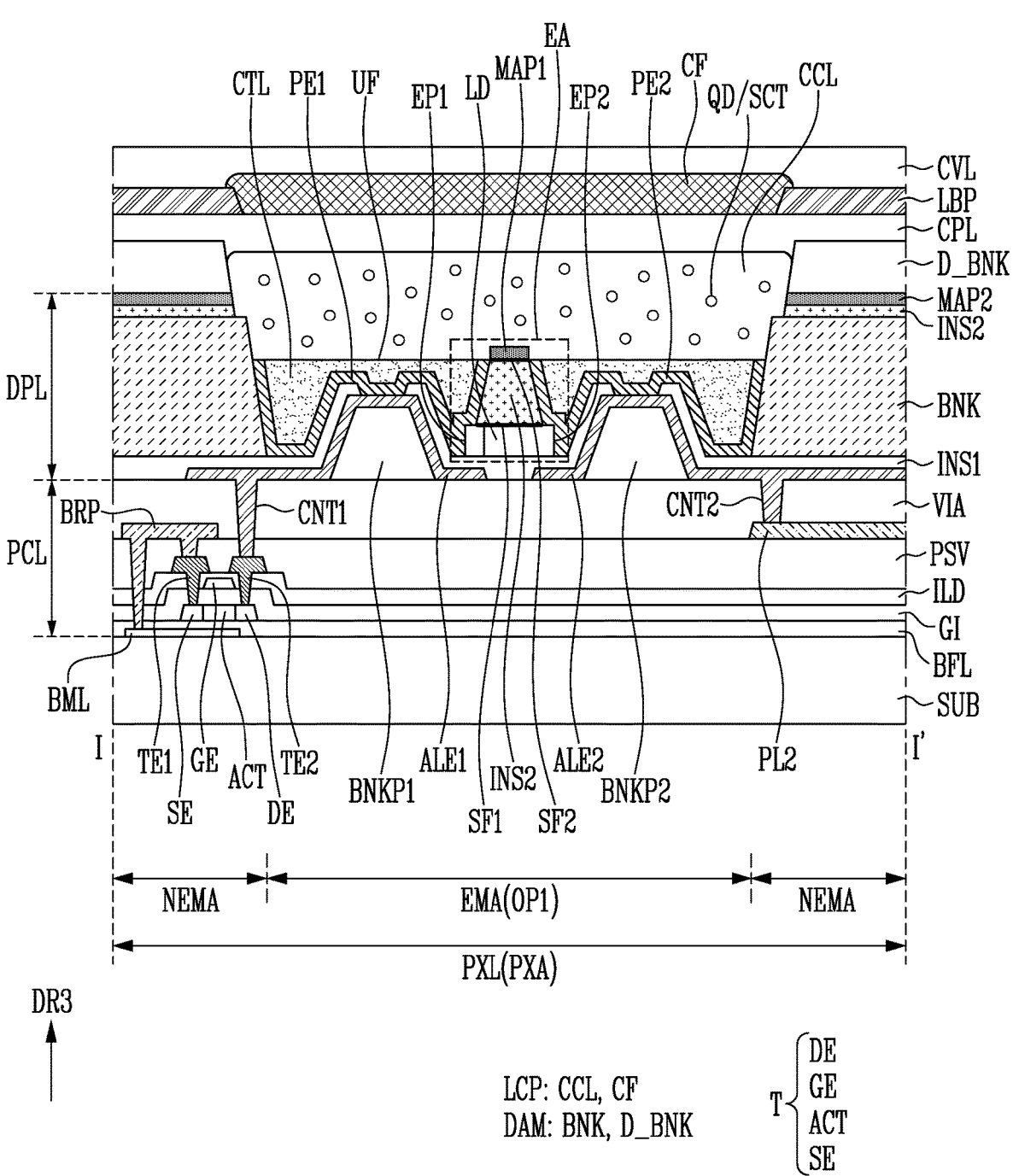

FIG. 6 illustrates a schematic cross-sectional view taken along line I-I' of FIG. 5.

Figure 7:
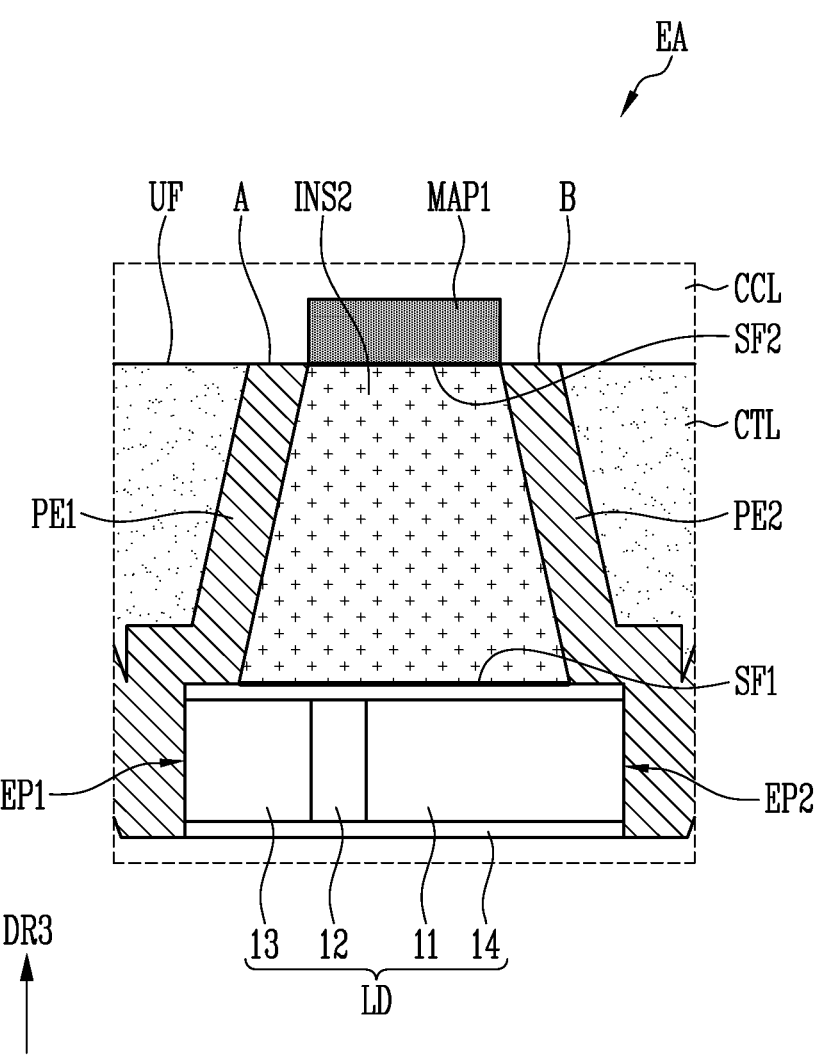

FIG. 7 illustrates a schematically enlarged cross-sectional view of portion EA of FIG. 6.

Figure 8:
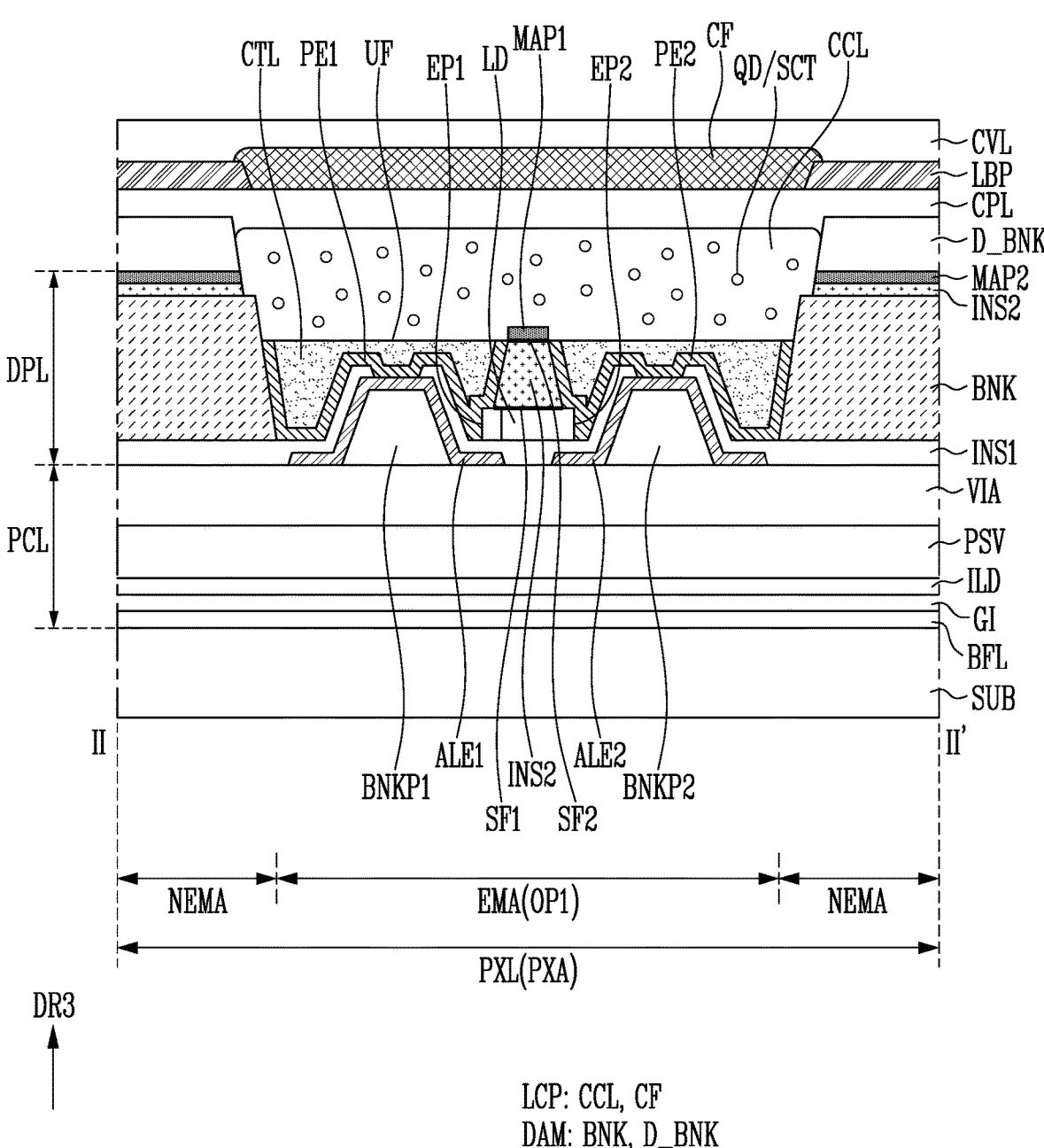
Figure 9:
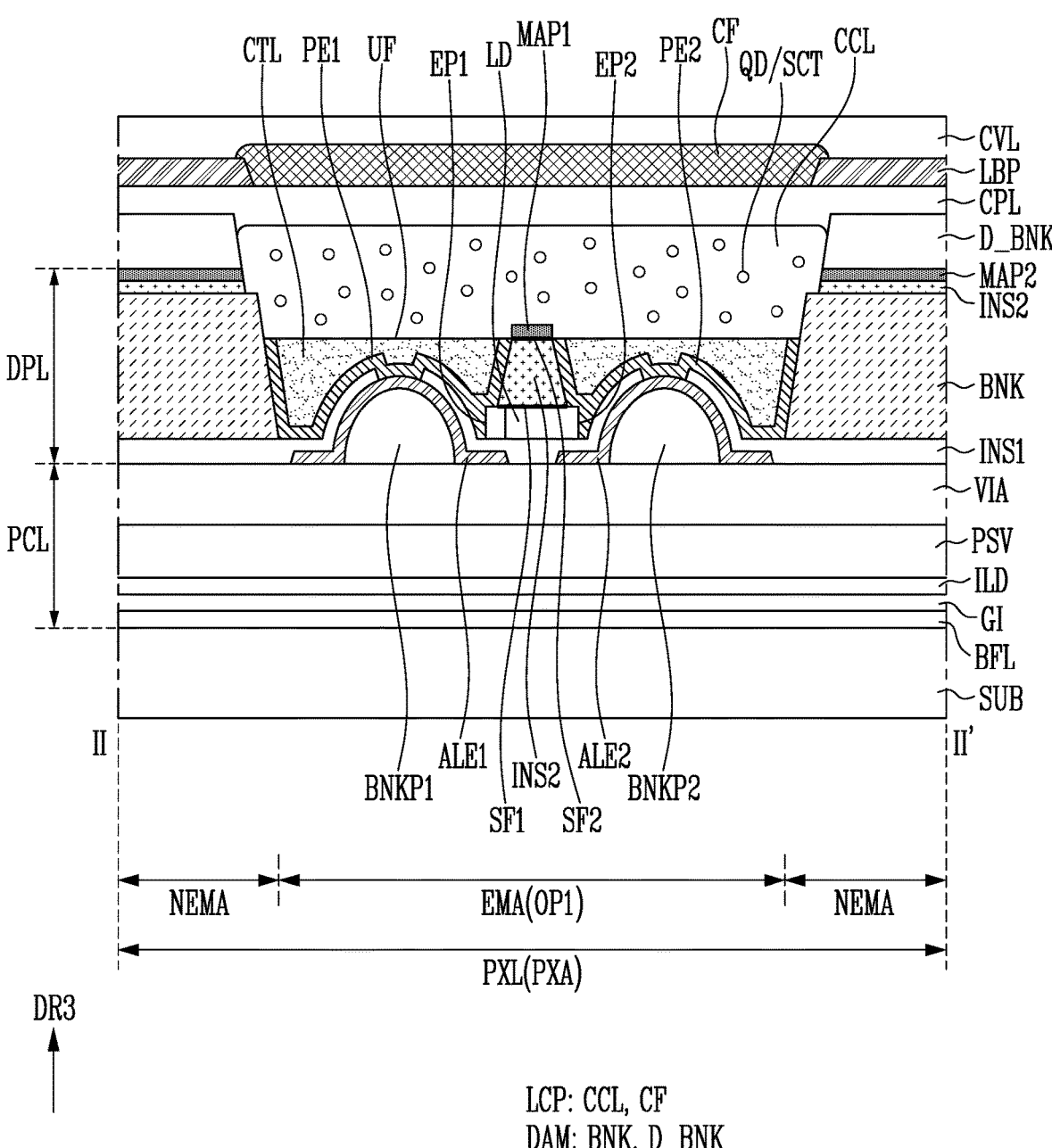
Figure 10:
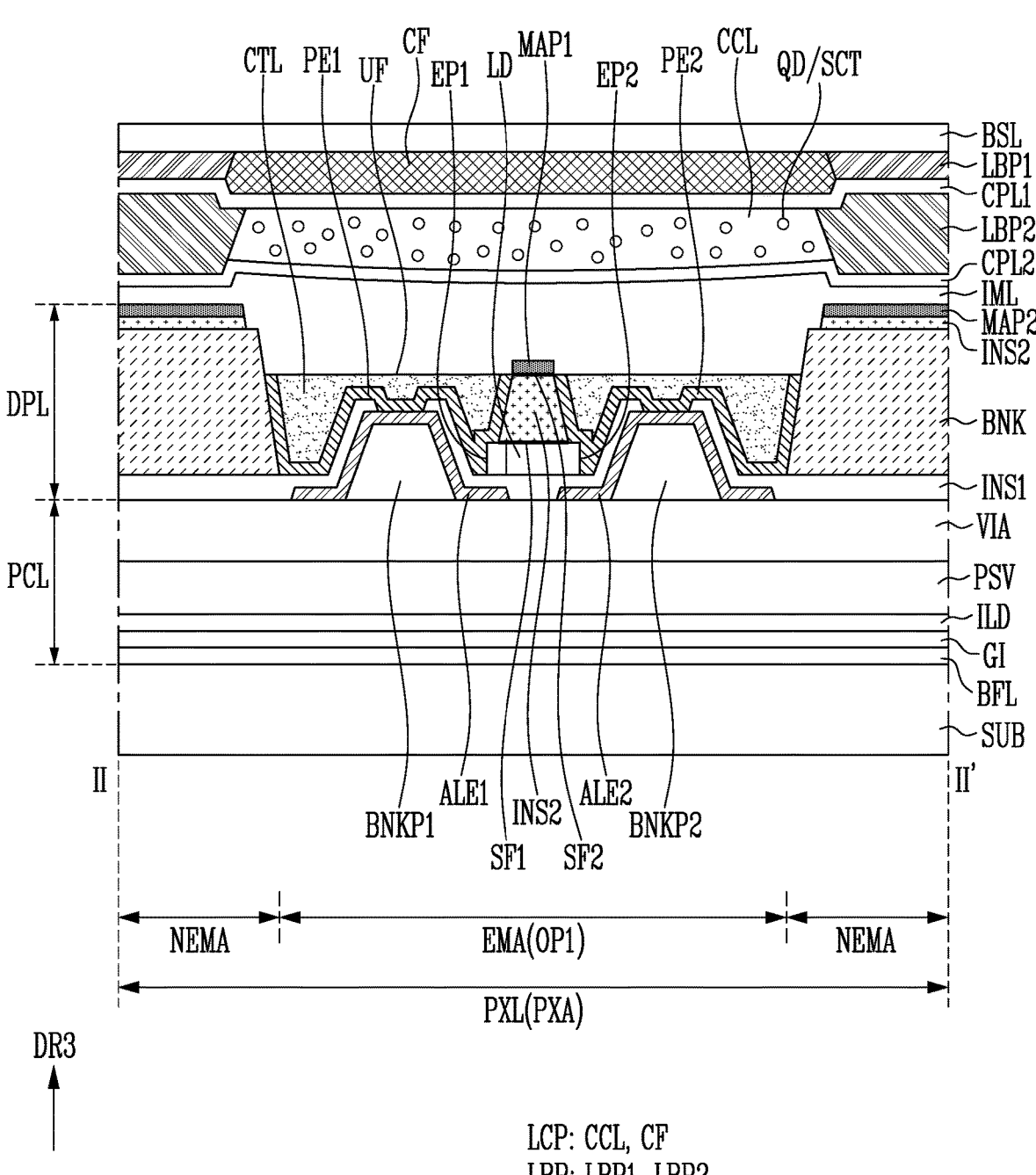
Figure 11:
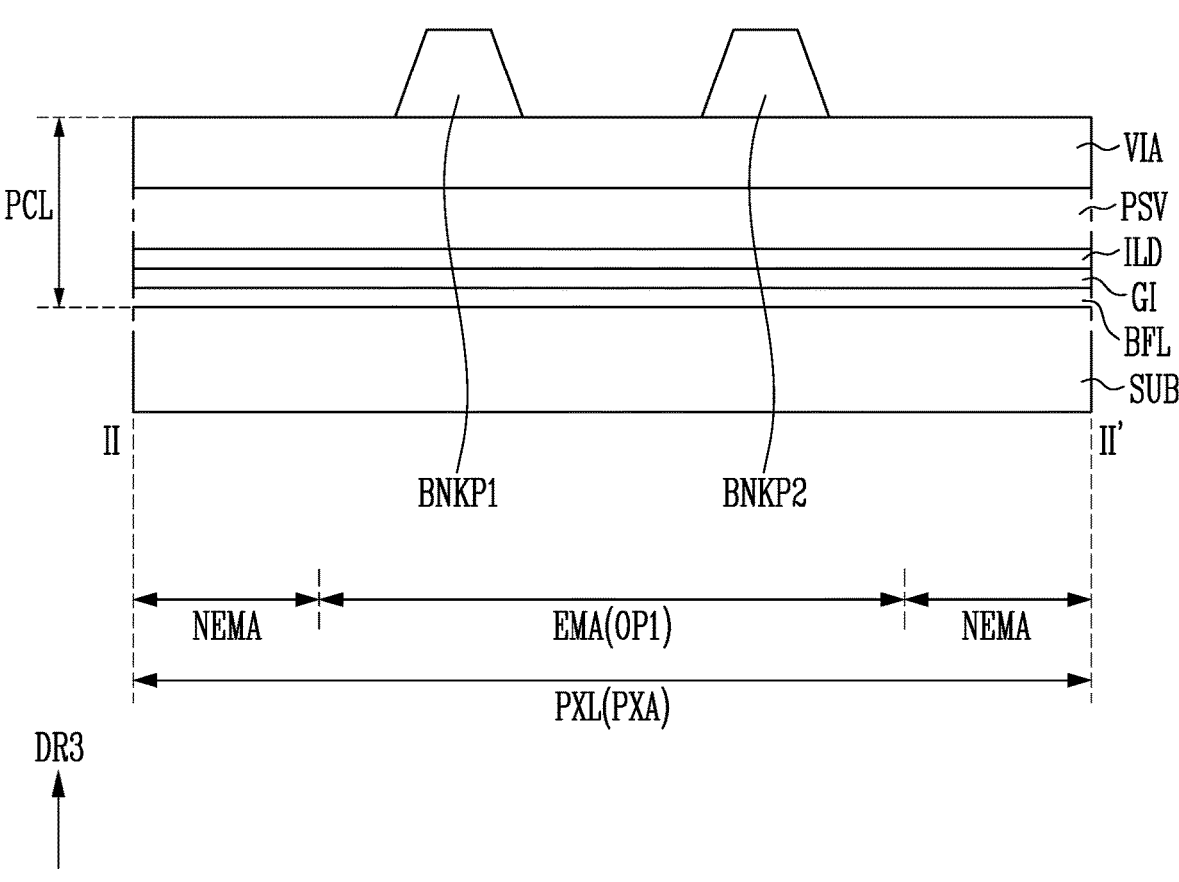
Figure 12:
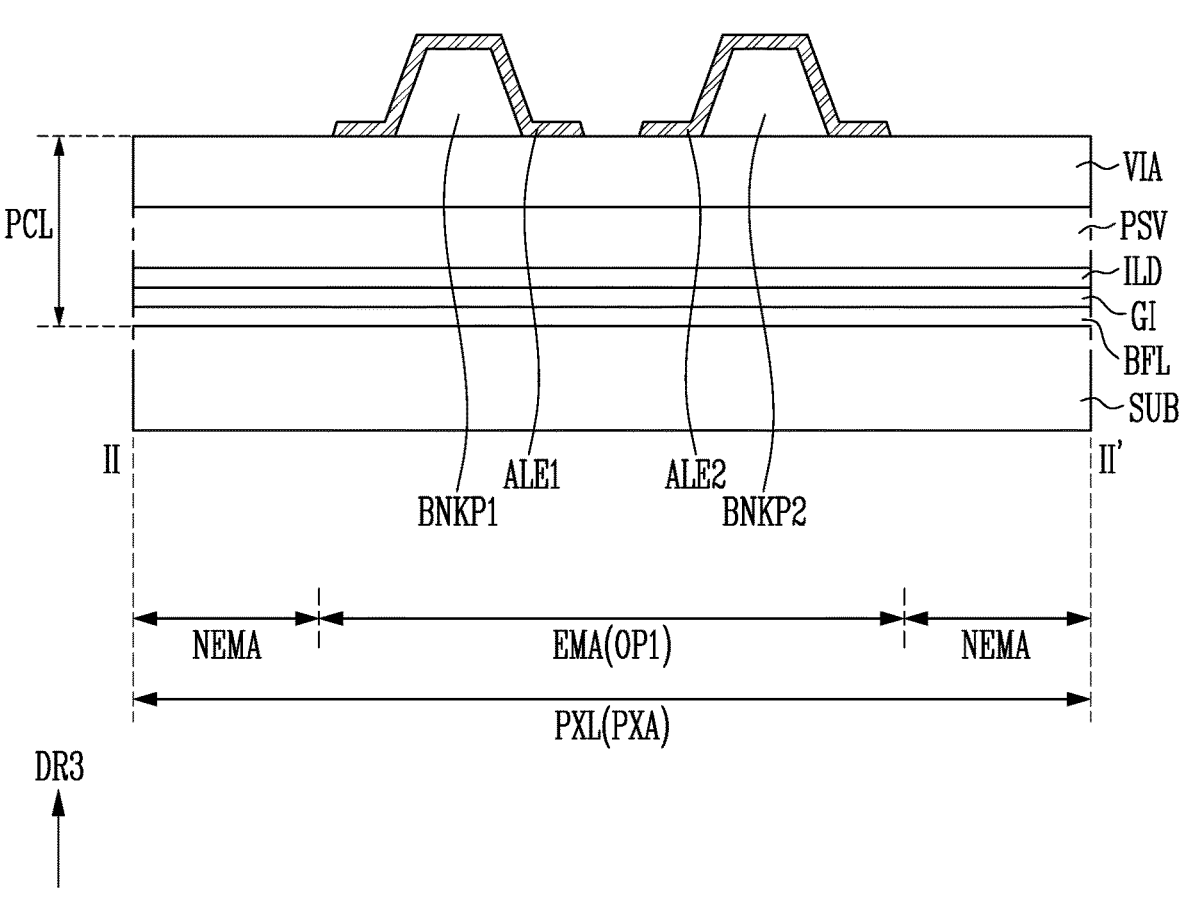
Figure 13:
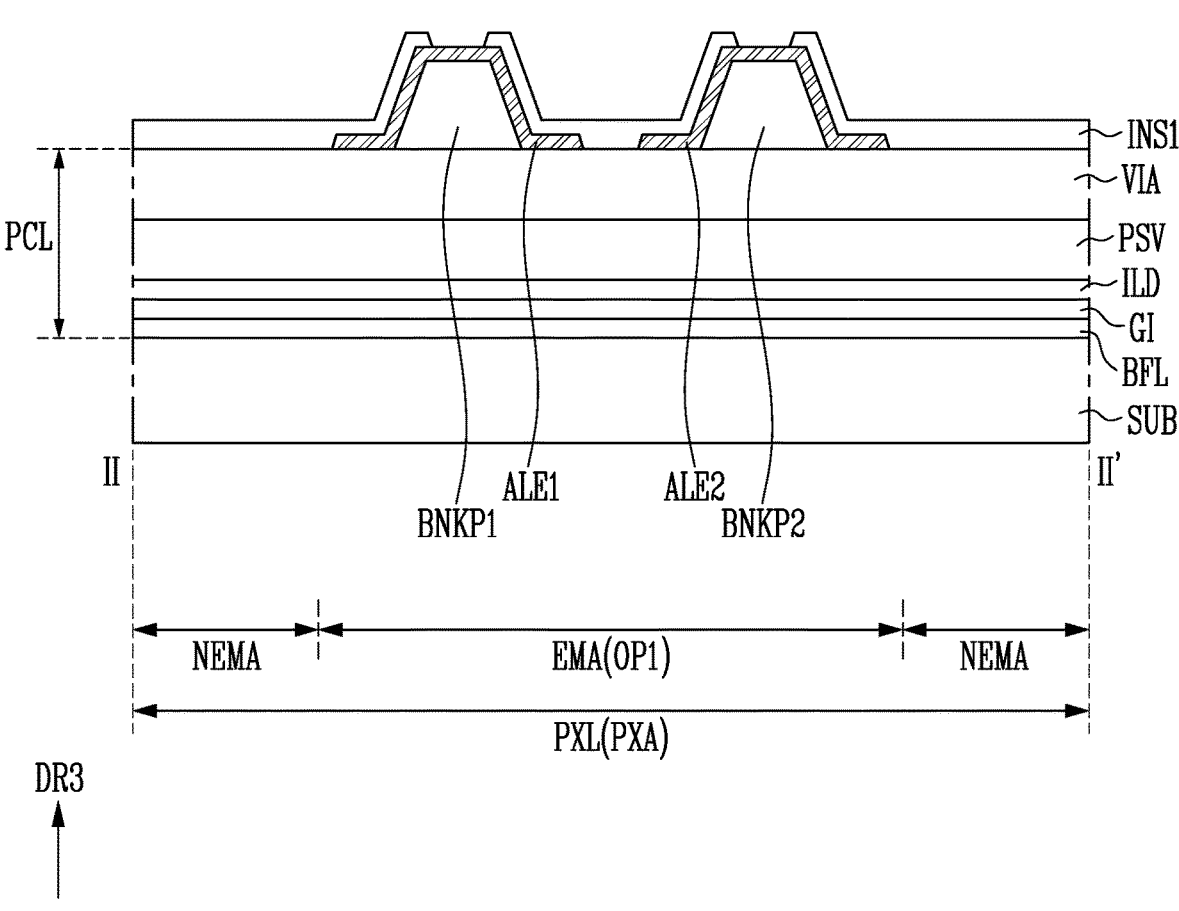
Figure 14:
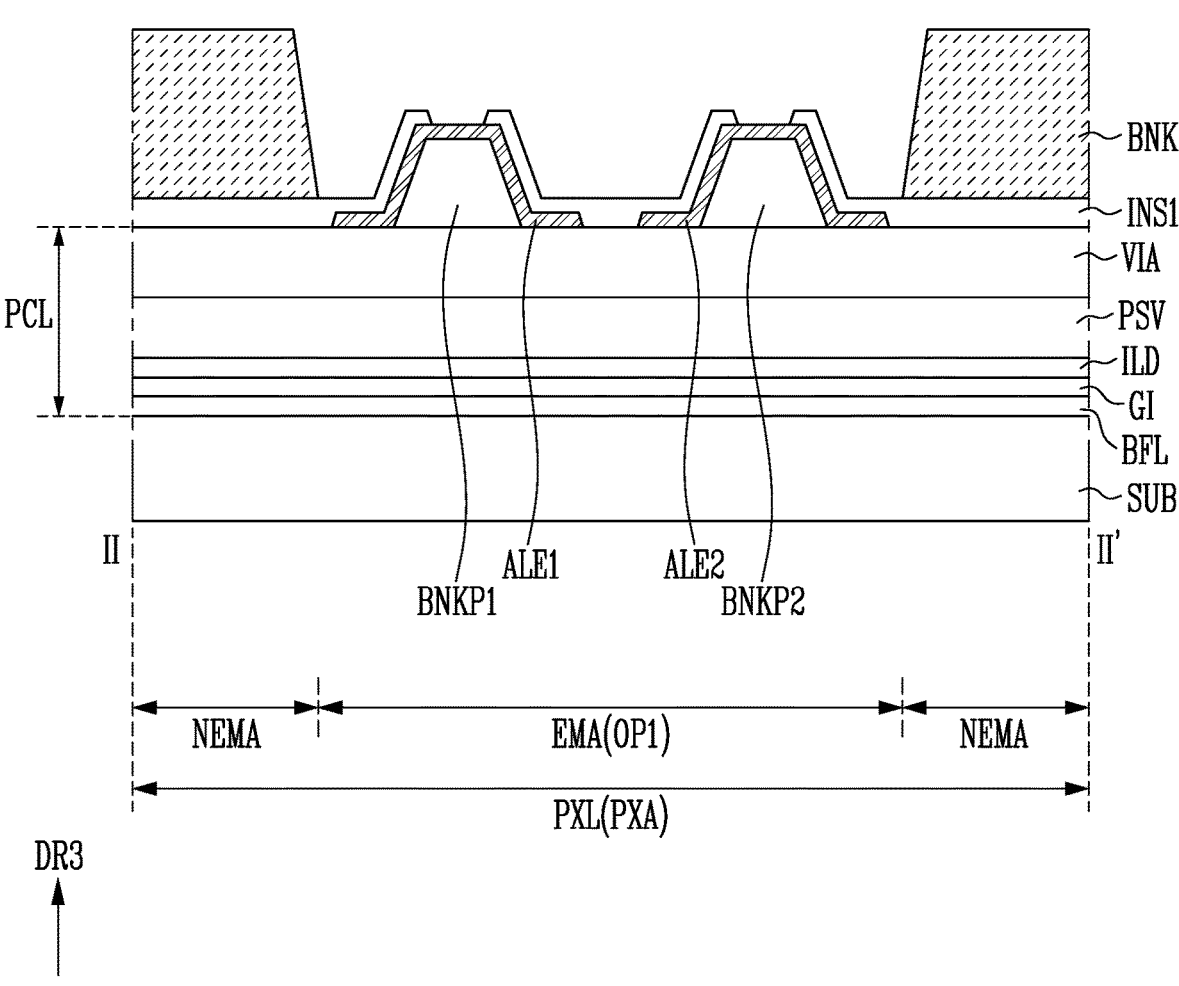
Figure 15:
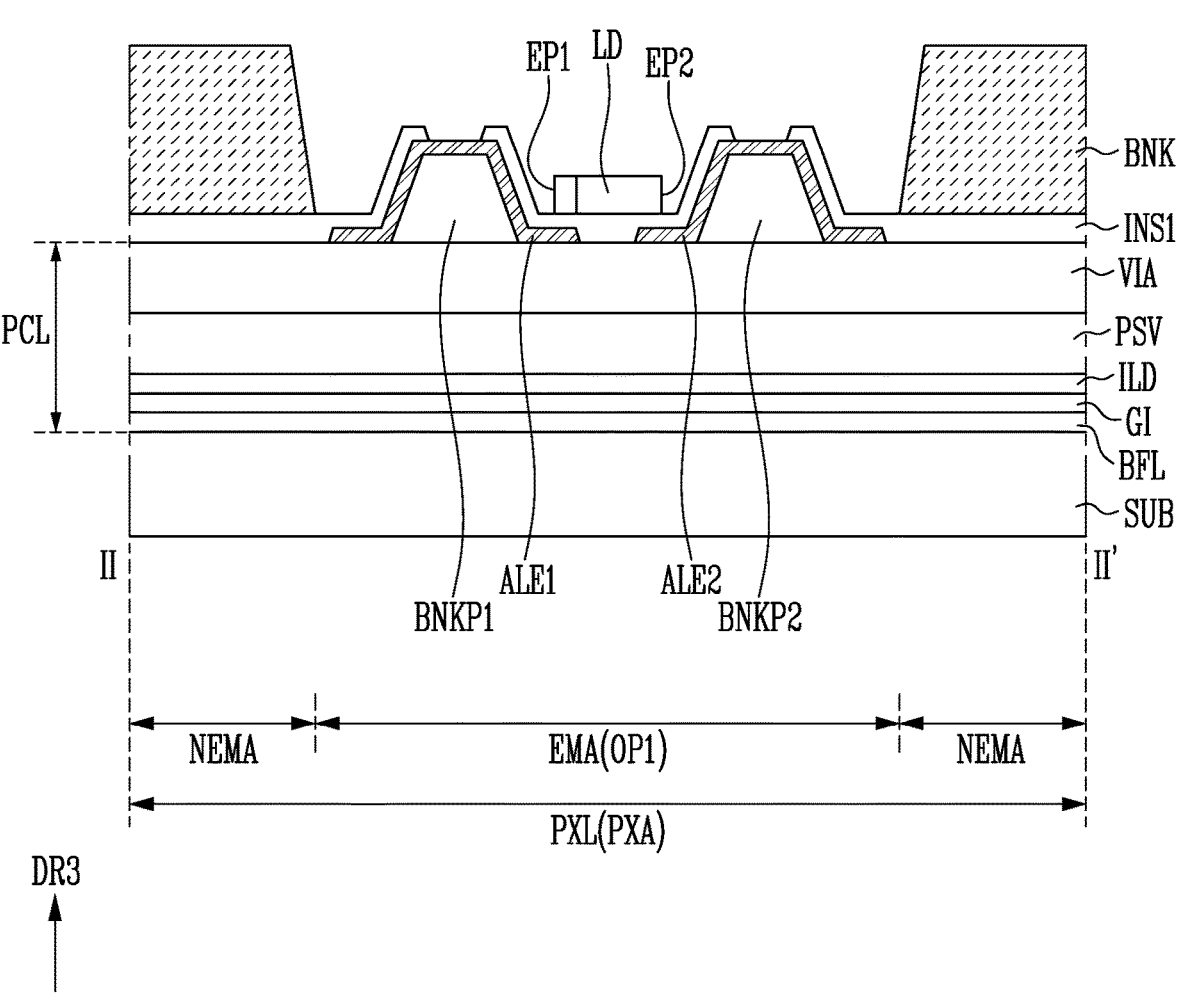
Figure 16:
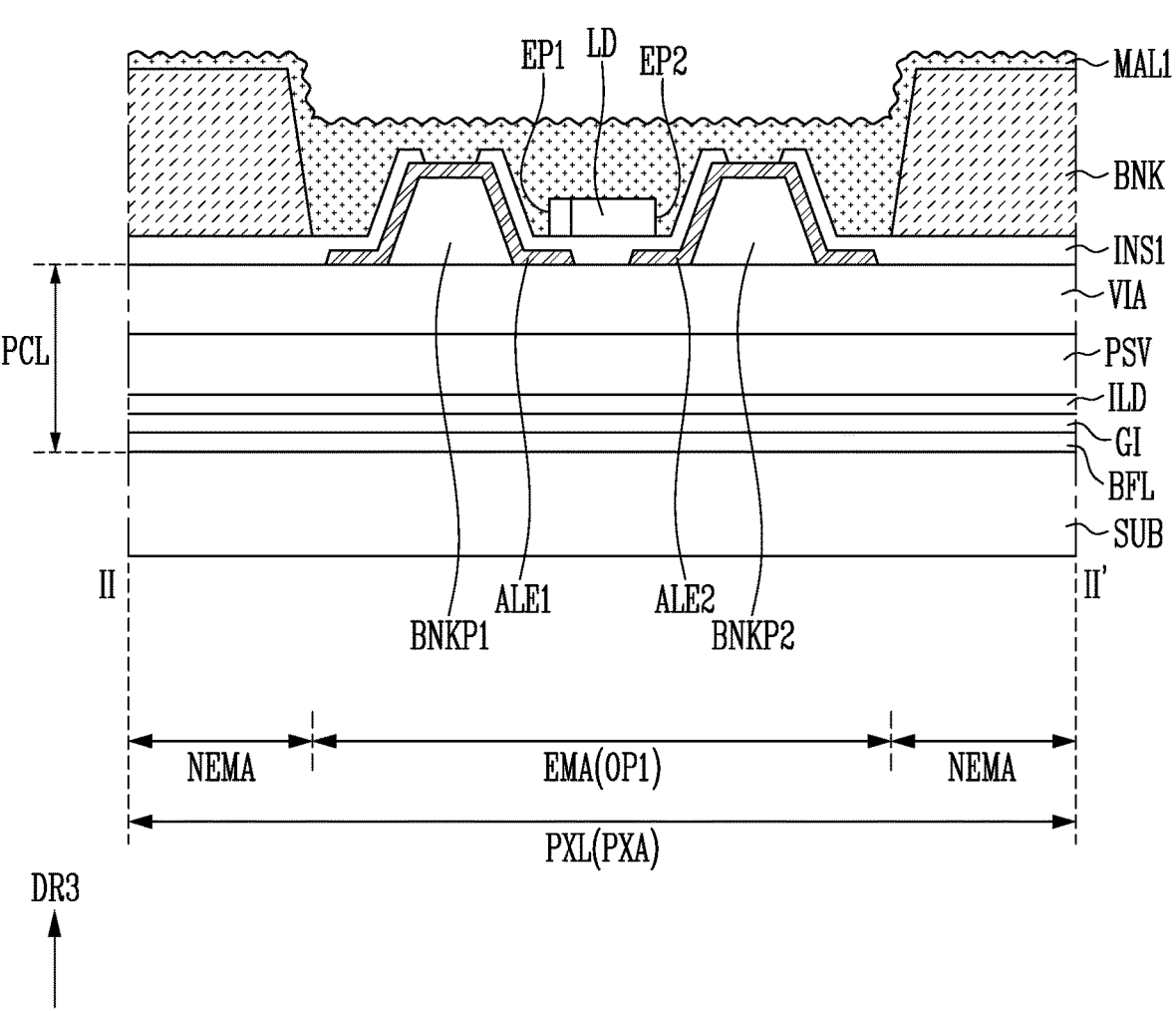
Figure 17:
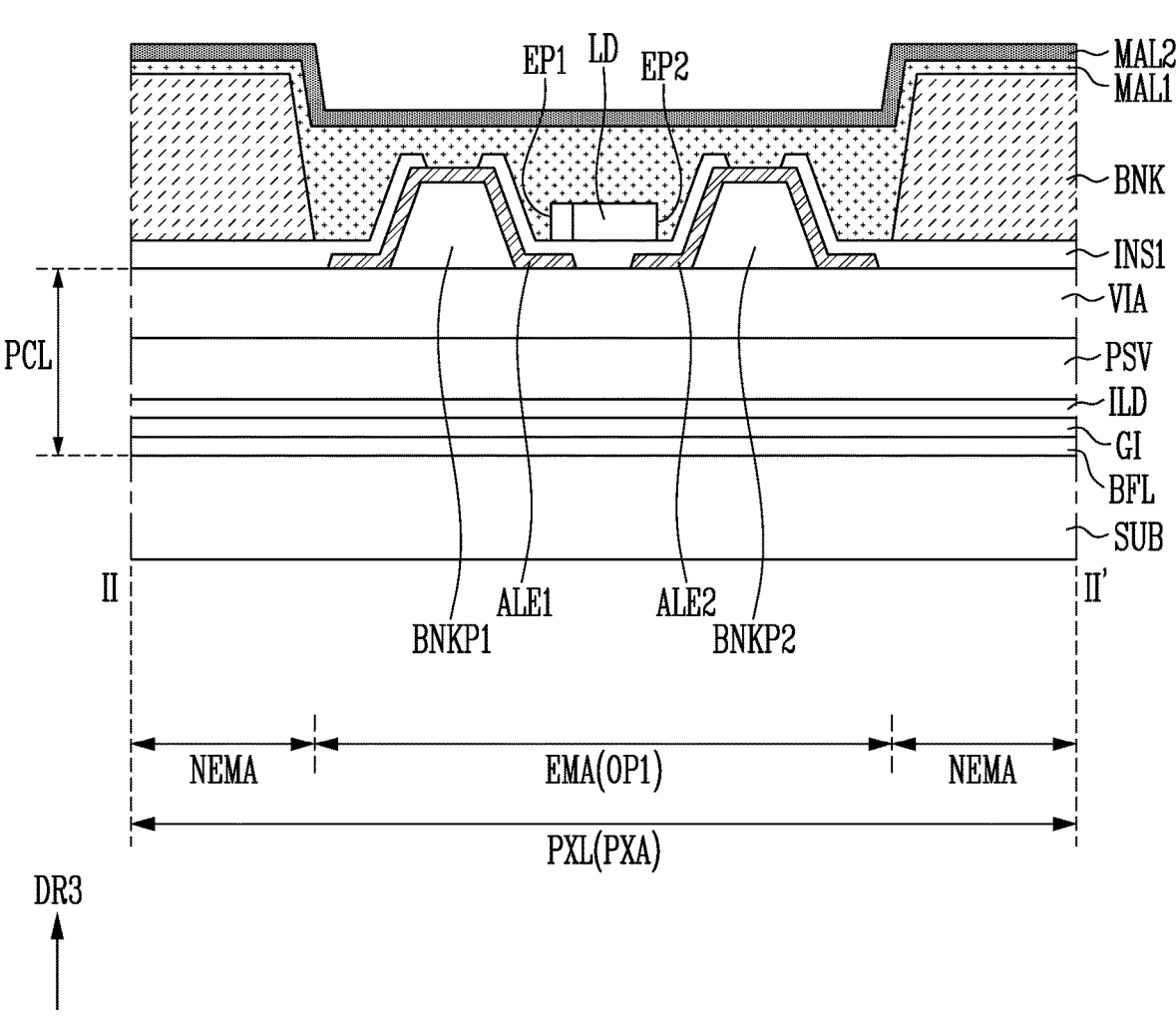
Figure 18:
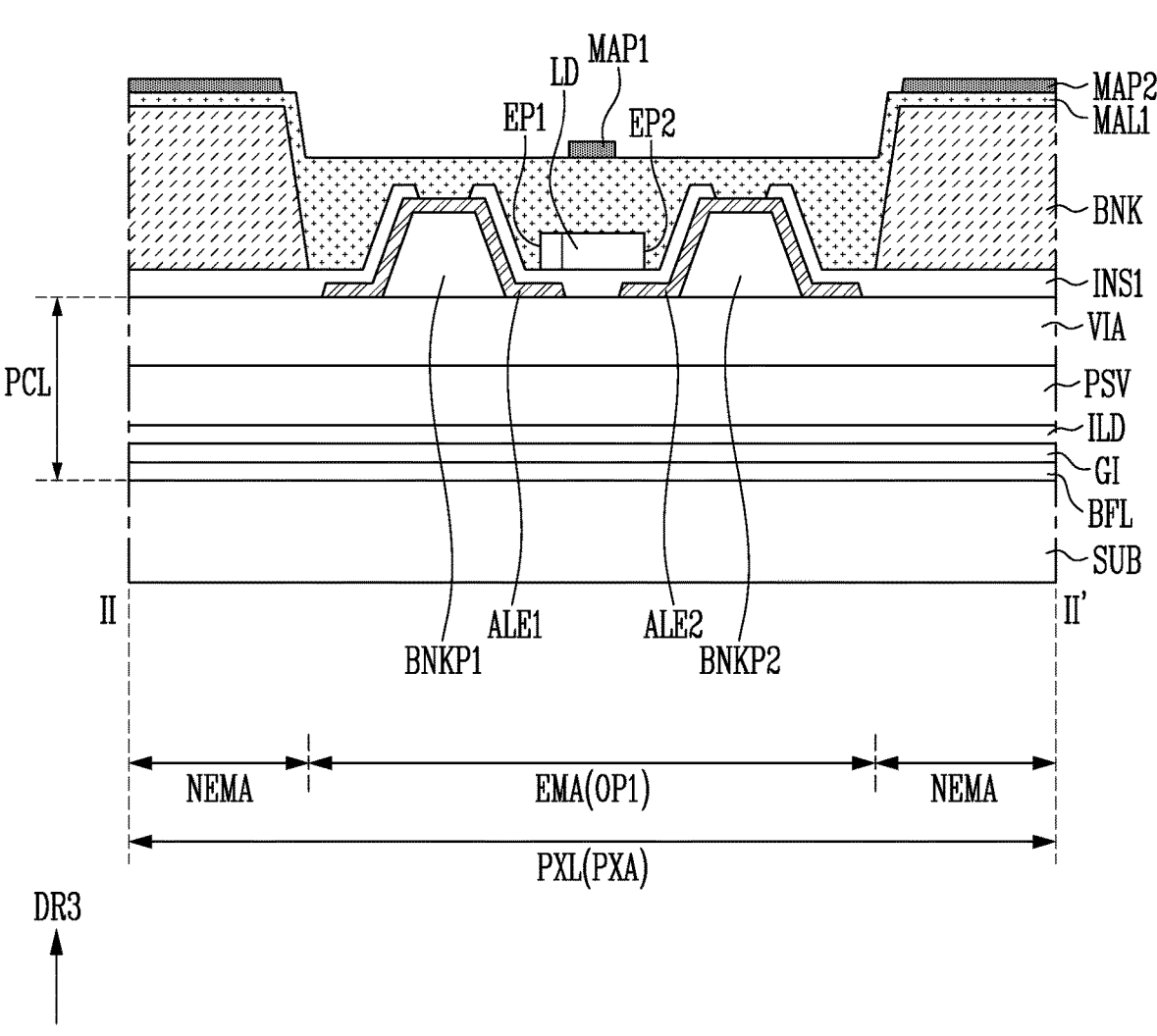
Figure 19:
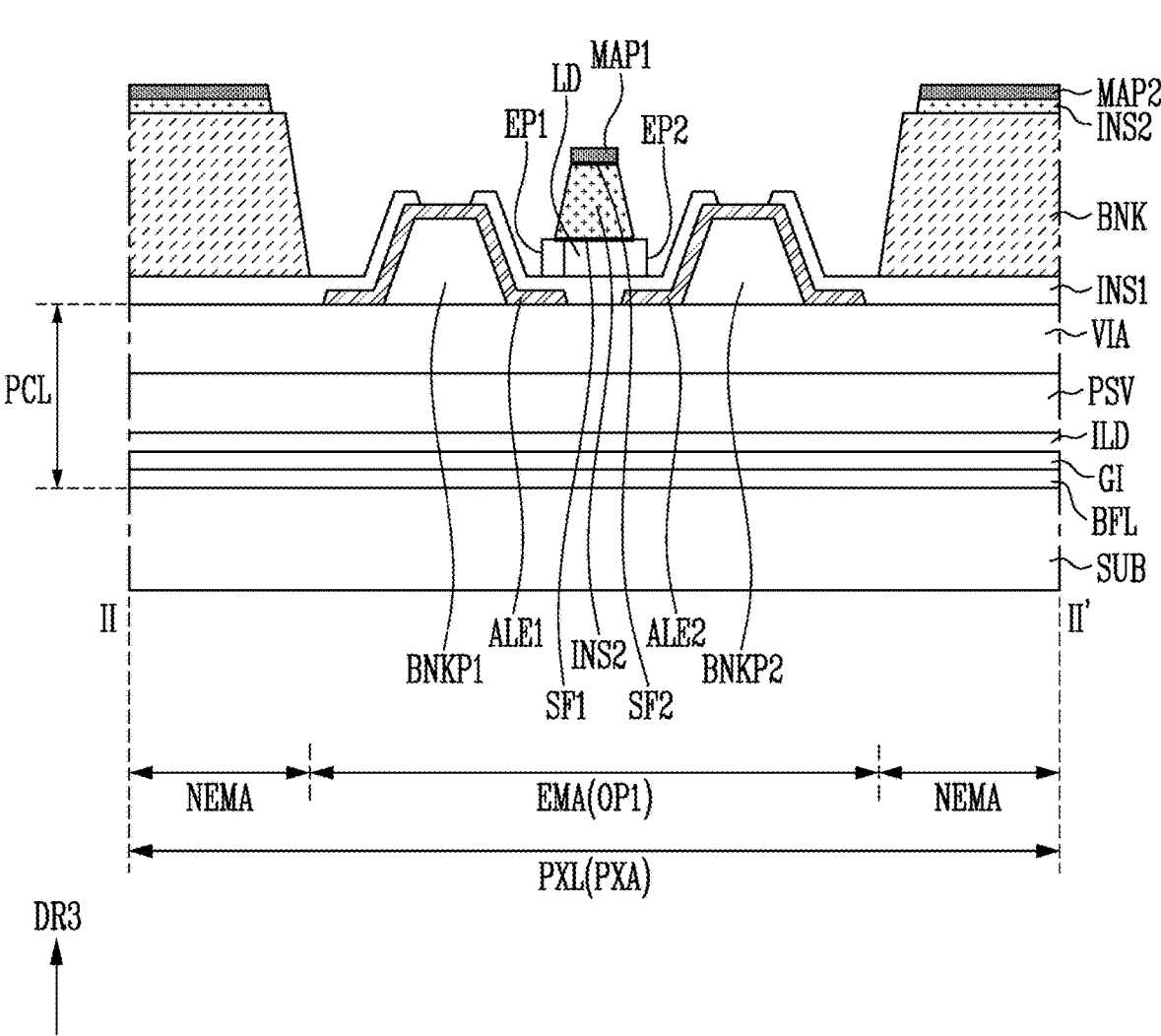
Figure 20:
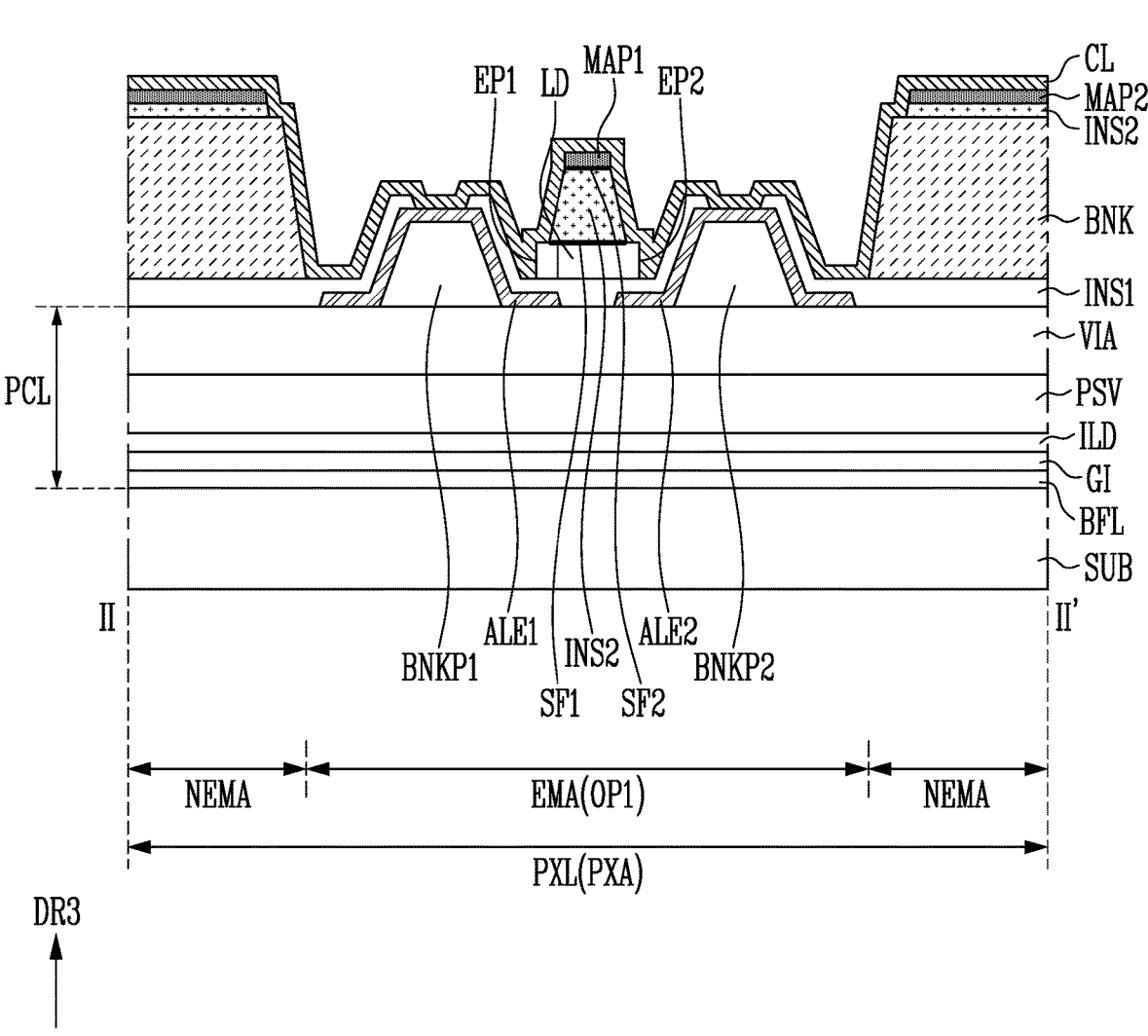
Figure 21:
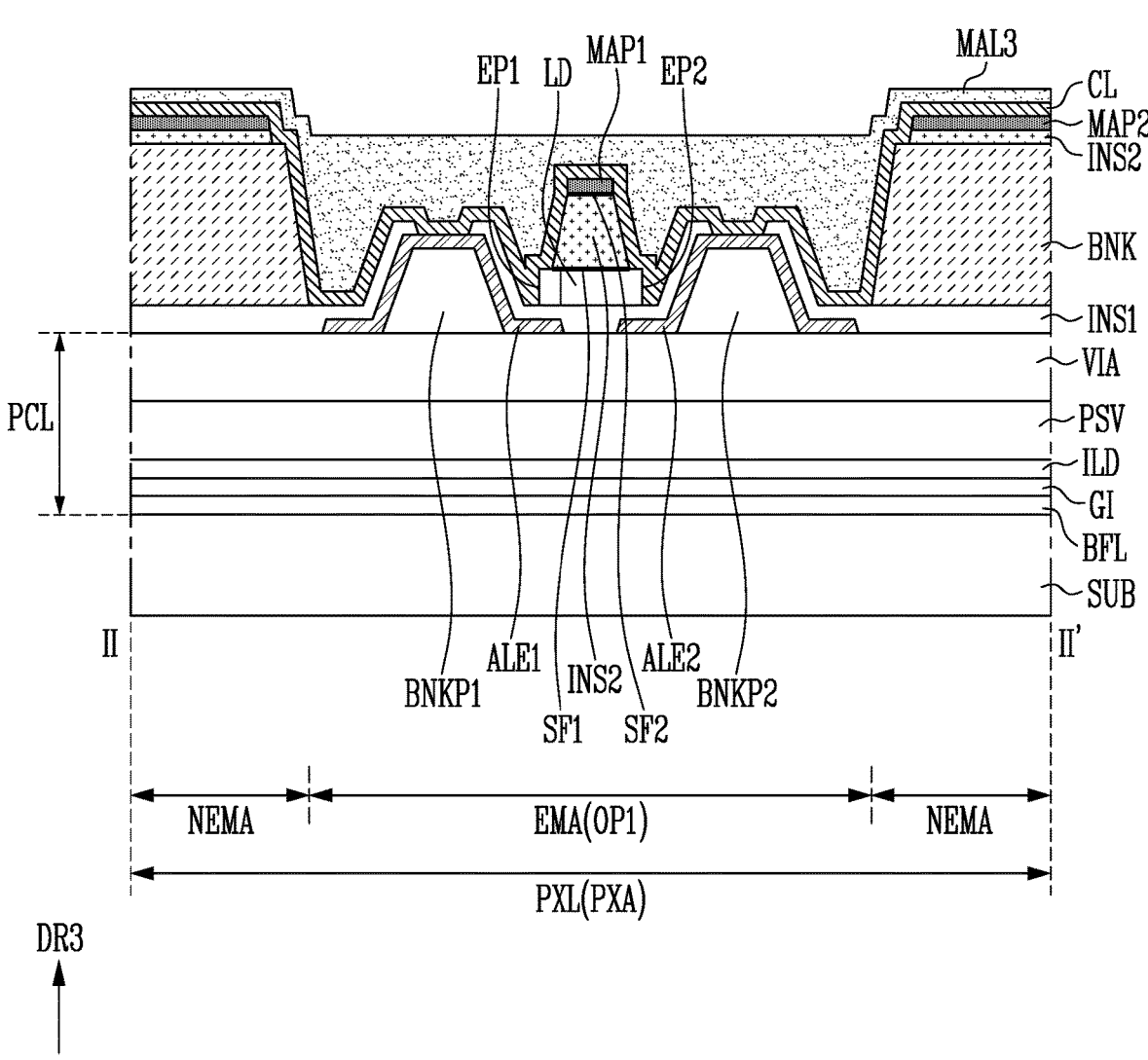
Figure 22:
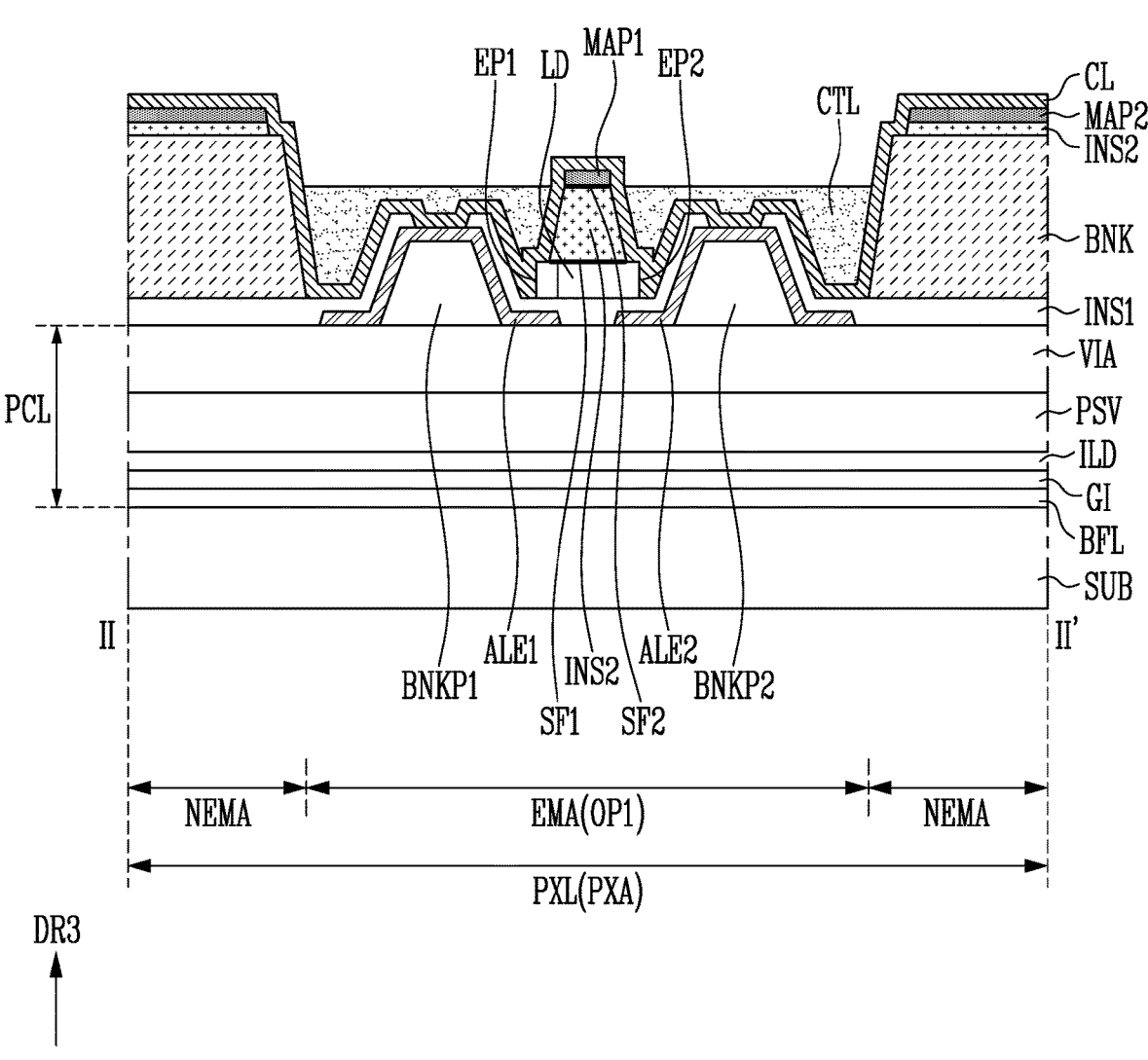

FIG. 8 to FIG. 10 illustrate schematic cross-sectional views taken along line II-II' of FIG. 5.

FIG. 11 to FIG. 23 illustrate cross-sectional views for schematically explaining a manufacturing method of a display element layer of a pixel of FIG. 7.

Figure 23:
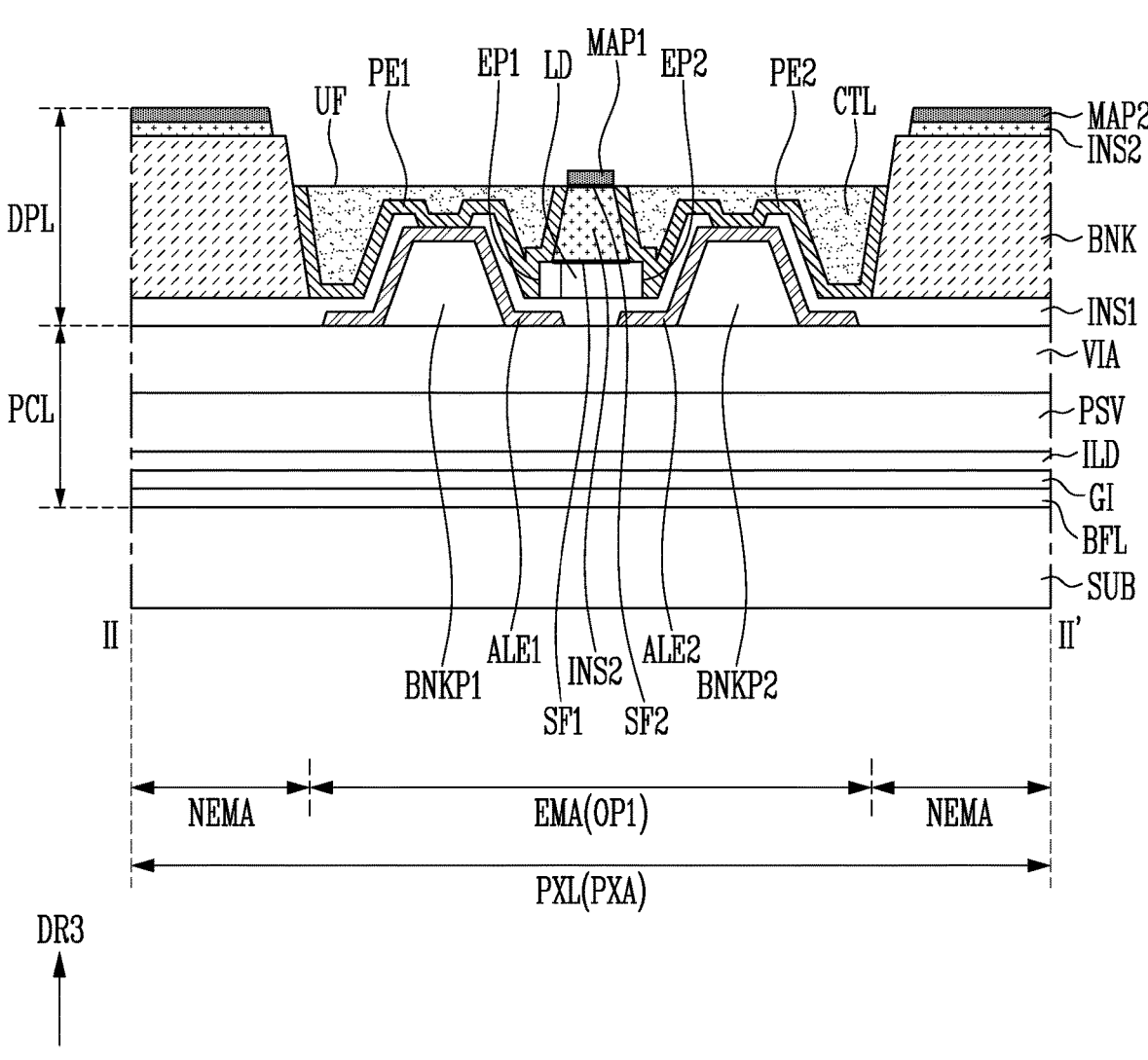
Figure 24:
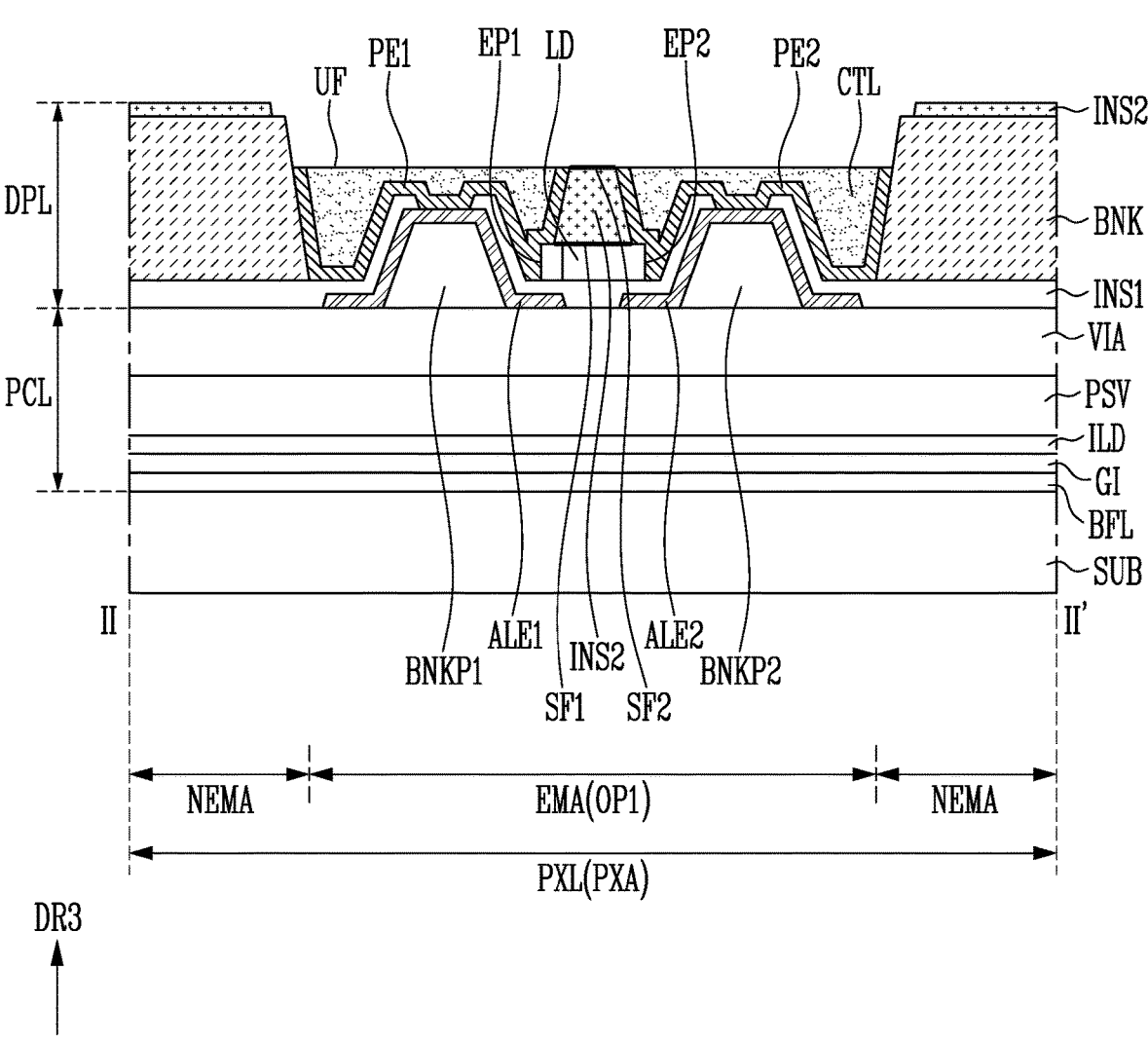

FIG. 24 illustrates a schematic cross-sectional view of the manufacturing method of the display element layer of FIG. 23 according to another embodiment.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Like reference numerals are used for like elements in describing each drawing. In the accompanying drawings, the dimensions of the structure may be exaggerated and shown for clarity of the disclosure. Terms such as first, second, and the like will be used only to distinguish various constituent elements, and are not to be interpreted as limiting these constituent elements. For example, a first constituent element could be termed a second constituent element, and similarly, a second constituent element could be termed as a first constituent element, without departing from the scope of the disclosure.

In the application, it should be understood that terms such as "include", "comprise", "have", and "configure" indicate that a feature, a number, a step, an operation, a constituent element, a part, or a combination thereof described in the application is present, but does not exclude a possibility of presence or addition of one or more other features, numbers, steps, operations, constituent elements, parts, or combinations.

It will be understood that when an element such as a layer, film, region, area, or substrate is referred to as being "on" another element, it can be directly on another element or intervening elements may also be present. In the application, when an element of a layer, film, region, area, plate, or the like is referred to as being formed "on" another element, the direction is not limited to an upper direction but includes a lateral or lower direction. In contrast, when an element of a layer, film, region, area, plate, or the like is referred to as being "below" another element, it may be directly below another element, or intervening elements may be present.

It is to be understood that, in the application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to another constituent element (for example, through a third constituent element). In contrast, it is to be understood that when it is described for one constituent element (for example, a first constituent element) to be "directly coupled or connected with/to" another constituent element (for example, a second constituent element), there may be no other constituent element (for example, a third constituent element) between the one constituent element and the another constituent element. Further, a connection may be an electrical connection and/or a physical connection.

In the description below, singular forms are to include plural forms unless the context clearly indicates only the singular.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" (and the like) is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
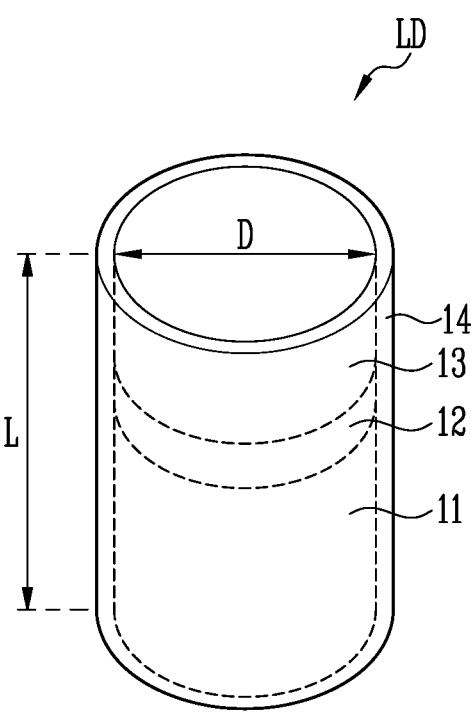
FIG. 1 illustrates a schematic perspective view of a light emitting element according to an embodiment of the disclosure.
Figure 2:
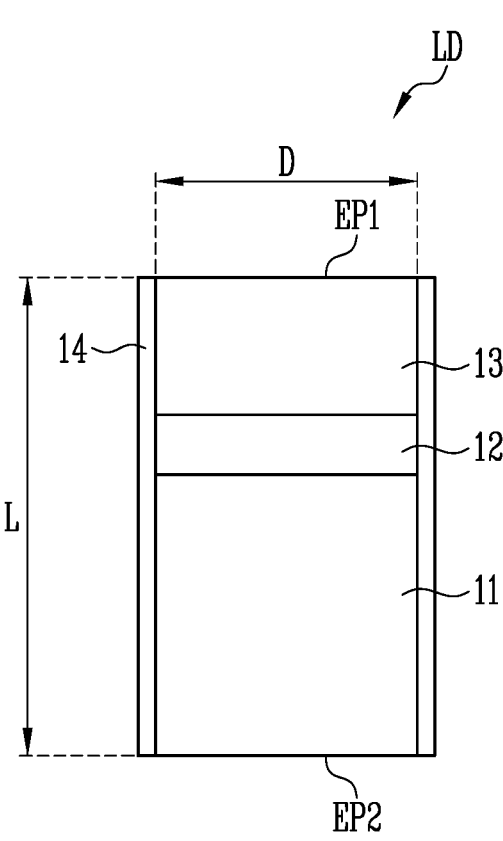
FIG. 2 illustrates a schematic cross-sectional view of the light emitting element of FIG. 1.

FIG. 1 illustrates a schematic perspective view of a light emitting element LD according to an embodiment of the disclosure, and FIG. 2 illustrates a schematic cross-sectional view of the light emitting element LD of FIG. 1.

In an embodiment, a type and/or shape of the light emitting element LD are not limited to embodiments shown in FIG. 1 and FIG. 2.

Referring to FIG. 1 and FIG. 2, the light emitting element LD may include a first semiconductor layer 11, a second semiconductor layer 13, and an active layer 12 interposed between the first and second semiconductor layers 11 and 13. For example, the light emitting element LD may be implemented as a stacked light emitting body (or a stacked pattern) in which the first semiconductor layer 11, the active layer 12, and the second semiconductor layer 13 are sequentially stacked on each other.

The light emitting element LD may be provided (disposed) to have a shape extending in a direction. In case that an extending direction of the light emitting element LD is a length direction, the light emitting element LD may include a first end EP1 and a second end EP2 along the length direction. One of the first semiconductor layer 11 and the second semiconductor layer 13 may be positioned on the first end EP1 of the light emitting element LD, and the other of the first semiconductor layer 11 and the second semiconductor layer 13 may be positioned on the second end EP2 of the light emitting element LD. For example, the second semiconductor layer 13 may be positioned on the first end EP1 of the light emitting element LD, and the first semiconductor layer 11 may be positioned on the second end EP2 of the corresponding light emitting element LD.

The light emitting element LD may be provided in various shapes. As an example, the light emitting element LD may have a rod-like shape, bar-like shape, or pillar shape that is long (or an aspect ratio larger than 1) in a length direction as shown in FIG. 1. As another example, the light emitting element LD may have a rod-like shape, bar-like shape, or pillar shape that is short (or an aspect ratio smaller than 1) in a length direction. As another example, the light emitting element LD may have a rod-like shape, bar-like shape, or pillar shape that has an aspect ratio of 1.

For example, the light emitting element LD may include a light emitting diode (LED) manufactured in a ultra-small size having a diameter D and/or a length L of nano scale (or nano meter) to micro scale (or micrometer).

In case that the light emitting element LD is long in a length direction (that is, an aspect ratio is larger than 1), the diameter D of the light emitting element LD may be about 0.5 μm to about 6 μm, and the length L thereof may be about 1 μm to about 10 μm. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD may be applied.

For example, the first semiconductor layer 11 may include at least one n-type semiconductor layer. For example, the first semiconductor layer 11 may include a semiconductor material of at least one of InAlGaN, GaN, AlGaN, InGaN, AlN, and InN, and may be an n-type semiconductor layer doped with a first conductive dopant (or n-type dopant) such as Si, Ge, Sn, or the like. However, the material included in the first semiconductor layer 11 is not limited thereto, and the first semiconductor layer 11 may be made of various materials. The first semiconductor layer 11 may include an upper surface contacting the active layer 12 along the length direction of the light emitting element LD and a lower surface exposed to the outside. The lower surface of the first semiconductor layer 11 may be an end (or lower end) of the light emitting element LD.

The active layer 12 may be disposed on the first semiconductor layer 11, and may be formed to have a single or multi-quantum well structure. For example, in case that the active layer 12 is formed of a multi-quantum well structure, the active layer 12 may have a structure in which a barrier layer (not shown), a strain reinforcing layer, and a well layer, which consist of a unit, may be periodically and repeatedly stacked. Since the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength of about 400 nm to about 900 nm, and may have a double hetero-structure. In an embodiment, a clad layer (not shown) doped with a conductive dopant may be formed above and/or below the active layer 12 along the length direction of the light emitting element LD. For example, the clad layer may be formed as an AlGaN layer or an InAlGaN layer. In some embodiments, a material such as AlGaN and InAlGaN may be used to form the active layer 12, and in addition, various materials may form the active layer 12. The active layer 12 may include the first surface contacting the first semiconductor layer 11 and the second surface contacting the second semiconductor layer 13.

In case that an electric field of a voltage or more is applied to respective ends of the light emitting element LD, the light emitting element LD emits light while electron-hole pairs may be combined in the active layer 12. By controlling the light emission of the light emitting element LD by using this principle, the light emitting element LD may be used as a light source (or light emitting source) for various light emitting devices in addition to pixels of a display device.

The second semiconductor layer 13 may be disposed on the second surface of the active layer 12, and may include a semiconductor layer of a type different from that of the first semiconductor layer 11. For example, the second semiconductor layer 13 may include at least one P-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg, Zn, Ca, Sr, and Ba. However, the material included in the second semiconductor layer 13 is not limited thereto, and the second semiconductor layer 13 may be formed of various materials. The second semiconductor layer 13 may include a lower surface contacting the second surface of the active layer 12 along the length direction of the light emitting element LD and an upper surface exposed to the outside. Here, the upper surface of the second semiconductor layer 13 may be another end (or upper end) of the light emitting element LD.

In an embodiment, the first semiconductor layer 11 and the second semiconductor layer 13 may have different thicknesses from each other in the length direction of the light emitting element LD. For example, the first semiconductor layer 11 may have a relatively thicker thickness than that of the second semiconductor layer 13 along the length direction of the light emitting element LD. Accordingly, the active layer 12 of the light emitting element LD may be disposed to be closer to the upper surface of the second semiconductor layer 13 than the lower surface of the first semiconductor layer 11.

It is illustrated that each of the first semiconductor layer 11 and the second semiconductor layer 13 is formed as one layer, but the disclosure is not limited thereto. In an embodiment, each of the first semiconductor layer 11 and the second semiconductor layer 13 may further include at least one layer, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but is not limited thereto.

In some embodiments, the light emitting element LD may further include a contact electrode (hereinafter referred to as a "first contact electrode") (not shown) disposed on the second semiconductor layer 13 in addition to the first semiconductor layer 11, the active layer 12, and the second semiconductor layer 13 described above. In another embodiment, another contact electrode (not shown, hereinafter referred to as a "second contact electrode") disposed on an end of the first semiconductor layer 11 may be further included.

Each of the first and second contact electrode electrodes may be an ohmic contact electrode, but the disclosure is not limited thereto. In some embodiments, the first and second contact electrodes may be a Schottky contact electrode. The first and second contact electrodes may include a conductive material. For example, the first and second contact electrodes may include an opaque metal in which chromium (Cr), titanium (Ti), aluminum (Al), gold (Au), nickel (Ni), and an oxide or alloy thereof are used alone or in combination, but are not limited thereto. In some embodiments, the first and second contact electrodes may include a transparent conductive oxide such as an indium tin oxide (ITO), an indium zinc oxide (IZO), a zinc oxide ($ZnO_x$), an indium gallium zinc oxide (IGZO), and/or an indium tin zinc oxide (ITZO). Here, the zinc oxide ($ZnO_x$) may be a zinc oxide (ZnO) and/or a zinc peroxide ($ZnO_2$).

Materials included in the first and second contact electrodes may be the same or different from each other. The first and second contact electrodes may be substantially transparent or translucent. Accordingly, light generated by the light emitting element LD may transmit through each of the first and the second contact electrodes to be outputted to the outside of the light emitting element LD. In some embodiments, in case that the light generated by the light emitting element LD does not transmit through the first and second contact electrodes and is discharged to the outside through an area except for respective ends of the light emitting element LD, the first and second contact electrodes may include an opaque metal.

In an embodiment, the light emitting element LD may further include an insulating film 14 (or an insulating film). However, in some embodiments, the insulating film 14 may be omitted, or it may be provided so as to cover only some of the first semiconductor layer 11, the active layer 12, and the second semiconductor layer 13.

The insulating film 14 may prevent an electrical short circuit that may occur in case that the active layer 12 contacts conductive materials other than the first and second semiconductor layers 11 and 13. The insulating film 14 may minimize surface defects of the light emitting element LD to improve lifespan and luminous efficiency of the light emitting element LD. In case that multiple light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The insulating film 14 may be provided in a form that entirely surrounds an outer circumferential surface of a light emitting stacked structure including the first semiconductor layer 11, the active layer 12, and the second semiconductor layer 13.

In the above-described embodiment, the structure in which the insulating film 14 entirely surrounds the outer circumferential surfaces of the first semiconductor layer 11, the active layer 12, and the second semiconductor layer 13 is described, but the disclosure is not limited thereto. In some embodiments, in case that the light emitting element LD includes the first contact electrode, the insulating film 14 may entirely surround the outer circumferential surface of each of the first semiconductor layer 11, the active layer 12, the second semiconductor layer 13, and the first contact electrode. According to another embodiment, the insulating film 14 may not entirely surround the outer circumferential surface of the first contact electrode, or may only surround a portion of the outer circumferential surface of the first contact electrode and may not surround the remaining portion of the external circumferential surface of the first contact electrode. In some embodiments, in case that the first contact electrode is disposed at another end (or an upper end) of the light emitting element LD and the second contact electrode is disposed at an end (or a lower end) of the light emitting element LD, the insulating film 14 may expose at least one area of each of the first and second contact electrodes.

The insulating film 14 may include a transparent insulating material. For example, the insulating film 14 may include at least one of a silicon oxide (SiO$_x$), a silicon nitride (SiN$_x$), a silicon oxynitride (SiO$_x$N$_y$), an aluminum oxide (AlO$_x$), a titanium oxide (TiO$_x$), a hafnium oxide (HfO$_x$), a titanium strontium oxide (SrTiO$_x$), a cobalt oxide (Co$_x$O$_y$), a magnesium oxide (MgO), zinc oxide (ZnO), a ruthenium oxide (RuO$_x$), a nickel oxide (NiO), a tungsten oxide (WO$_x$), a tantalum oxide (TaO$_x$), a gadolinium oxide (GdO$_x$), a zirconium oxide (ZrO$_x$), a gallium oxide (GaO$_x$), a vanadium oxide (V$_x$O$_y$), a ZnO:Al, a ZnO:B, a In$_x$O$_y$:H, a niobium oxide (Nb$_x$O$_y$), a magnesium fluoride (MgF$_x$), a fluorinated aluminum (AlF$_x$), an alucone polymer film, a titanium nitride (TiN), a tantalum nitride (TaN), an aluminum nitride (AlN$_x$), a gallium nitride (GaN), a tungsten nitride (WN), a hafnium nitride (HfN), a niobium nitride (NbN), a gadolinium nitride (GdN), a zirconium nitride (ZrN), and a vanadium nitride (VN), but the disclosure is not limited thereto, and various materials having insulating properties may be used as the material of the insulating film 14.

The insulating film 14 may be provided in a form of a single layer or in a form of a multilayer including a double layer. For example, in case that the insulating film 14 is configured as a double layer including a first insulating layer and a second insulating layer that are sequentially stacked on each other, the first insulating layer and the second insulating layer may be made of different materials (or substances), and may be formed by different processes. In some embodiments, the first insulating layer and the second insulating layer may include the same material to be formed by a continuous process.

In some embodiments, the light emitting element LD may be implemented in a light emitting pattern having a core-shell structure. The above-described first semiconductor layer 11 may be positioned at a core, that is, a middle (or center) of the light emitting element LD, and the active layer 12 may surround the outer circumferential surface of the first semiconductor layer 11, and the second semiconductor layer 13 may be provided and/or formed to surround the active layer 12. The light emitting element LD may further include a contact electrode (not shown) surrounding at least one side of the second semiconductor layer 13. In some embodiments, the light emitting element LD may further include the insulating film 14 disposed at the outer circumferential surface of the light emitting pattern having a core-shell structure and including a transparent insulating material. The light emitting element LD implemented in the light emitting pattern having the core-shell structure may be manufactured by a growth method.

The above-described light emitting element LD may be used as a light emitting source (or light source) for various display devices. The light emitting element LD may be manufactured through a surface treatment process. For example, in case that the light emitting elements LD are mixed with a fluid solution (or a solvent) and supplied to each pixel area (for example, an emission area of each pixel or an emission area of each sub pixel), each light emitting element LD may be surface-treated so that the light emitting elements LD may be non-uniformly aggregated in the solution and may be uniformly sprayed.

A light emitting unit (or light emitting device) including the above-described light emitting element LD may be used in various types of electronic devices that require a display device and a light source. For example, in case that multiple light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
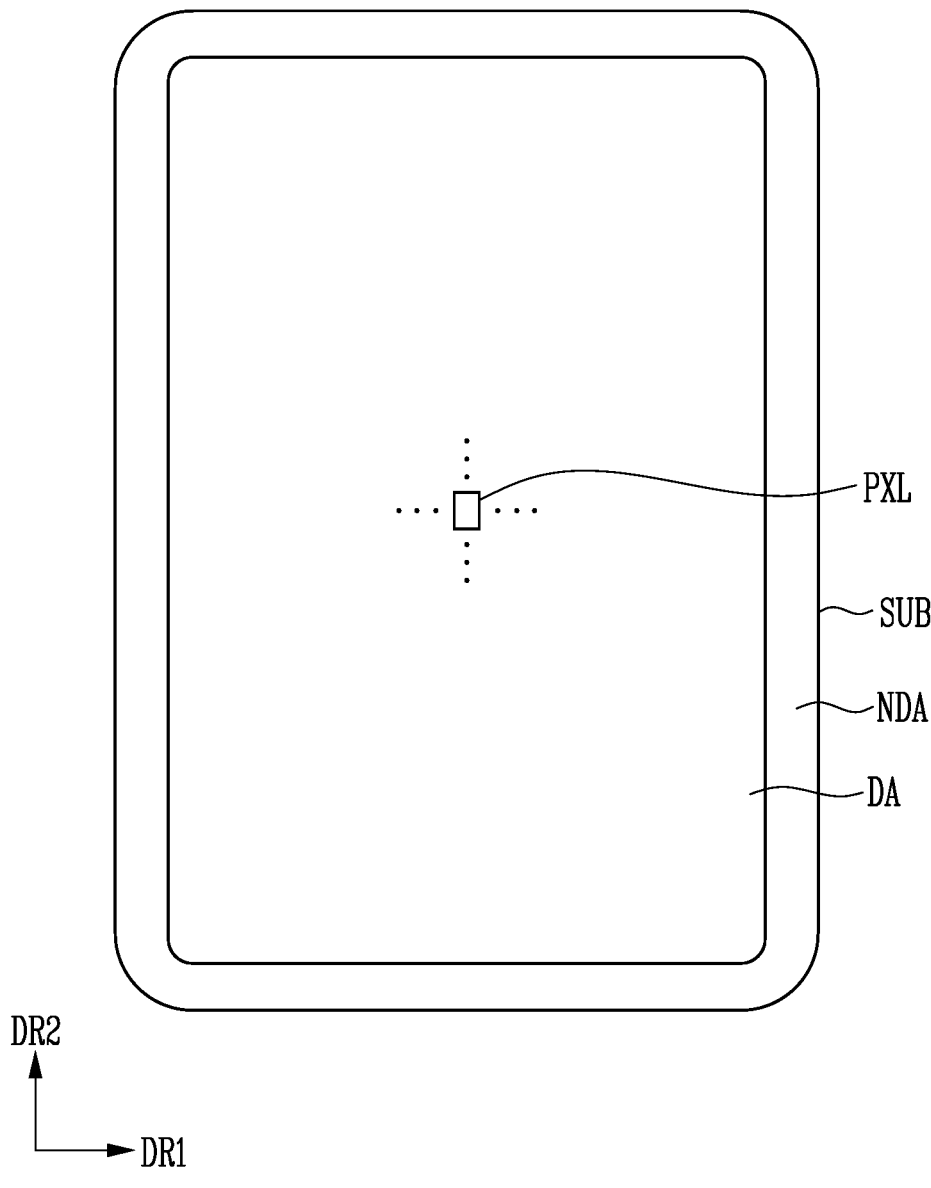
FIG. 3 illustrates a schematic top plan view of a display device according to an embodiment of the disclosure.

FIG. 3 illustrates a schematic top plan view of a display device according to an embodiment of the disclosure.

In FIG. 3, for convenience, a structure of the display device is briefly illustrated based on a display area DA on which an image may be displayed.

In case that the display device is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the disclosure may be applied thereto.

Referring to FIG. 1 to FIG. 3, the display device may include a substrate SUB, pixels PXL disposed in the substrate SUB and respectively including at least one light emitting element LD, a driver disposed in the substrate SUB and driving the pixels PXL, and a wire part connecting the pixels PXL and the driver.

The display device may be classified into a passive matrix type display device and an active matrix type display device according to a method of driving the light emitting element LD. For example, in case that the display device is implemented as the active matrix type display device, each of the pixels PXL may include a driving transistor for controlling an amount of current supplied to the light emitting element LD, a switching transistor for transmitting a data signal to the driving transistor, and the like.

The display device may be provided in various shapes, and as an example, may be provided in a rectangular plate shape having two pairs of sides parallel to each other, but is not limited thereto. In case that the display device is provided in the rectangular plate shape, one of the two pairs of sides may be provided to be longer than another pair of sides. For convenience of description, it is illustrated that the display device has a rectangular shape with a pair of long sides and a pair of short sides, and an extension direction of the long side is indicated as a second direction DR2, and an extension direction of the short side is indicated as a first direction DR1. In the display device provided in a rectangular plate shape, a corner portion in which one long side and one short side contact (or meet) may have a round shape, but is not limited thereto.

The substrate SUB may include a display area DA and a non-display area NDA.

The display area DA may be an area in which the pixels PXL for displaying an image may be provided. The non-display area NDA may be an area in which the driver for driving the pixels PXL and a portion of the wire part for connecting the driving and the pixels PXL may be provided. For better understanding and ease of description, only one pixel PXL is shown in FIG. 3, but multiple pixels PXL may be substantially provided in the display area DA of the substrate SUB.

The non-display area NDA may be disposed to be adjacent to the display area DA. The non-display area NDA may be provided at one or more sides of the display area DA. For example, the non-display area NDA may surround a circumference (or edge) of the display area DA. The non-display area NDA may be provided with a wire part connected to the pixels PXL and a driver for driving the pixels PXL.

The wire part may electrically connect the driver and the pixels PXL. The wire part may provide a signal to each pixel PXL, and may be signal lines connected to each pixel PXL, for example, a fan-out line connected to a scan line, a data line, a light emitting control line, and the like. In some embodiments, the wire part may include a fan-out line connected to signal lines connected to each pixel PXL, for example, connected to a control line, a sensing line, and the like, in order to compensate for changes in electrical characteristics of each pixel PXL in real time. The wire part may include a fan-out line that provides a voltage to each pixel PXL and is connected to power lines connected to each pixel PXL.

The substrate SUB may include a transparent insulating material to transmit light. The substrate SUB may be a rigid substrate or a flexible substrate.

An area on the substrate SUB may be provided as the display area DA in which pixels PXL may be disposed, and the remaining area on the substrate SUB may be provided as the non-display area NDA. For example, the substrate SUB may include the display area DA including pixel areas in which respective pixels PXL may be disposed, and the non-display area NDA disposed around the display area DA (or adjacent to the display area DA).

Each of the pixels PXL may be provided in the display area DA on the substrate SUB. In an embodiment, the pixels PXL may be arranged in the display area DA in a stripe arrangement structure or a PenTile® arrangement structure, but embodiments are not limited thereto.

Each pixel PXL may include at least one light emitting element LD driven by corresponding scan and data signals. A light emitting element LD may have a size as small as a nano-scale (or nano-meter) to a micro-scale (or micro-meter) and may be connected in parallel to light emitting elements disposed to be adjacent thereto, but embodiments are not limited thereto. The light emitting element LD may form a light source of each pixel PXL.

Each pixel PXL may include at least one light source, for example, the light emitting element LD shown in FIG. 1 and FIG. 2 driven by a signal (for example, a scan signal, a data signal, and the like) and/or a power source (for example, a first driving power source and a second driving power source). However, in an embodiment, the type of the light emitting element LD that may be used as the light source of each pixel PXL is not limited thereto.

The driver may supply a signal and a power source to each pixel PXL through the wire part, thereby controlling driving of the pixel PXL.

Figure 4:
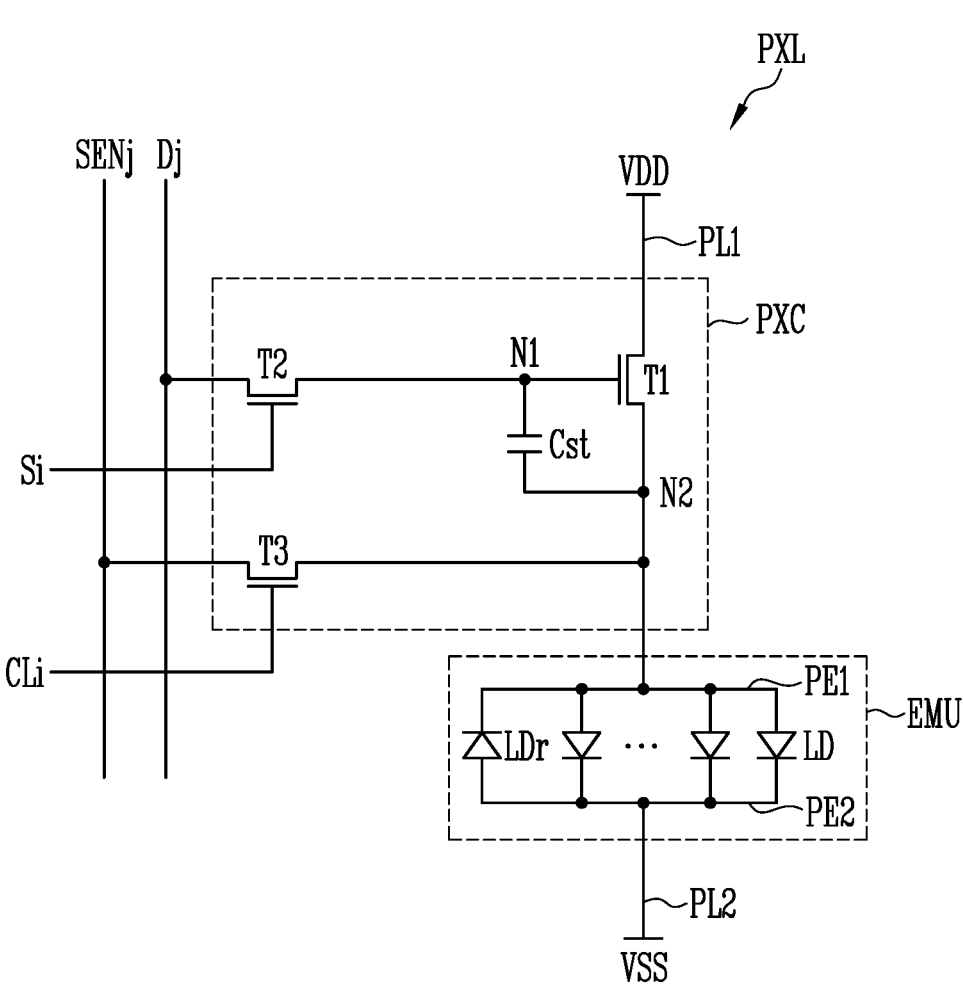
FIG. 4 illustrates a schematic circuit diagram of an electrical connection relationship between constituent elements included in a pixel illustrated in FIG. 3.

FIG. 4 illustrates a schematic circuit diagram of an electrical connection relationship between constituent elements included in the pixel PXL illustrated in FIG. 3.

For example, FIG. 4 illustrates an electrical connection relationship between constituent elements included in a pixel PXL that may be provided to an active matrix type of display device. However, the electrical connection relationship of the constituent elements included in the pixel PXL that may be applied to an embodiment is not limited thereto.

Referring to FIG. 1 to FIG. 4, the pixel PXL may include a light emitting unit EMU (or light emitting layer) that generates light with luminance corresponding to a data signal. The pixel PXL may further selectively include a pixel circuit PXC for driving the light emitting unit EMU.

In some embodiments, the light emitting unit EMU may include light emitting elements LD connected in parallel between a first power line PL1 that may be connected to a first driving power source VDD to receive a voltage of the first driving power source VDD and a second power line PL2 that may be connected to a second driving power source VSS to receive a voltage of the second driving power source VSS. For example, the light emitting unit EMU may include a first pixel electrode PE1 connected to the first power source VDD via the pixel circuit PXC and the first power line PL1, a second pixel electrode PE2 connected to the second power source VSS through the second power line PL2, and light emitting elements LD connected in parallel in the same direction between the first and second electrodes PE1 and PE2. In an embodiment, the first pixel electrode PE1 may be an anode, and the second pixel electrode PE2 may be a cathode.

Each of the light emitting elements LD included in the light emitting unit EMU may include an end connected to the first driving power source VDD through the first pixel electrode PE1 and another end connected to the second driving power source VSS through the second pixel electrode PE2. The first driving power source VDD and the second driving power source VSS may have different potentials. For example, the first driving power source VDD may be set as a high potential power source, and the second driving power source VSS may be set as a low potential power source. A potential difference between the first and second driving power sources VDD and VSS may be set to be equal to or higher than a threshold voltage of the light emitting elements LD during a light emitting period of the pixel PXL.

As described above, respective light emitting elements LD connected in parallel in the same direction (for example, a forward direction) between the first pixel electrode PE1 and the second pixel electrode PE2 supplied with voltages of different power sources may form respective effective light sources.

The light emitting elements LD of the light emitting unit EMU may emit light with luminance corresponding to a driving current supplied through the corresponding pixel circuit PXC. For example, during each frame period, a driving current corresponding to a gray value of corresponding frame data of the pixel circuit PXC may be supplied to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

In the above-described embodiment, although a structure has been described in which both ends of the light emitting elements LD may be connected in the same direction between the first and second driving power sources VDD and VSS, the disclosure is not limited thereto. In some embodiments, the light emitting unit EMU may further include at least one ineffective light source, for example, a reverse-directed light emitting element LDr, in addition to the light emitting elements LD forming respective effective light sources. The reverse-directed light emitting element LDr may be connected in parallel between the first and second pixel electrodes PE1 and PE2 together with the light emitting elements LD forming the effective light sources, but may be connected between the first and second pixel electrodes PE1 and PE2 in the opposite direction with respect to the light emitting elements LD. The reverse-directed light emitting element LDr may maintain an inactive state even in case that a driving voltage (for example, a driving voltage in the forward direction) is applied between the first and second pixel electrodes PE1 and PE2, thus a current may not substantially flow in the reverse light emitting element.

The pixel circuit PXC may be connected to a scan line Si and a data line Dj of the pixel PXL. The pixel circuit PXC may be connected to a control line CLi and a sensing line SENj of the pixel PXL. For example, in case that the pixel PXL is disposed to an i-th row and a j-th column of the display area DA, the pixel circuit PXC of the pixel PXL may be connected to the i-th scan line Si, the j-th data line Dj, an i-th control line CLi, and a j-th sensing line SENj of the display area DA.

The pixel circuit PXC may include first to third transistors T1 to T3 and a storage capacitor Cst.

The first transistor T1 may be a driving transistor for controlling a driving current applied to the light emitting unit EMU, and may be connected between the first driving power source VDD and the light emitting unit EMU. Specifically, a first terminal of the first transistor T1 may be connected to the first driving power source VDD through the first power line PL1, a second terminal of the first transistor T1 may be connected to a second node N2, and a gate electrode of the first transistor T1 may be connected to a first node N1. The first transistor T1 may control an amount of the driving current applied to the light emitting unit EMU from the first driving power source VDD through the second node N2 according to a voltage applied to the first node N1. In an embodiment, the first terminal of the first transistor T1 may be a drain electrode, and the second terminal of the first transistor T1 may be a source electrode, but the disclosure is not limited thereto. In some embodiments, the first terminal thereof may be a source electrode, and the second terminal thereof may be a drain electrode.

The second transistor T2 may be a switching transistor that selects the pixel PXL in response to a scan signal and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 may be different terminals, and for example, in case that the first terminal is a drain electrode, the second terminal may be a source electrode.

In case that a scan signal of a gate-on voltage (for example, a high level voltage) is supplied from the scan line Si, the second transistor T2 may be turned on to electrically connect the data line Dj and the first node N1. The first node N1 may be a point at which the second terminal of the second transistor T2 may be connected to the gate electrode of the first transistor T1, and the second transistor T2 may transmit a data signal to the gate electrode of the first transistor T1.

The third transistor T3 connects the first transistor T1 to the sensing line SENj, so that it may obtain a sensing signal through the sensing line SENj, and may detect a characteristic of the pixel PXL in addition to a threshold voltage of the first transistor T1 by using the sensing signal. Information on the characteristics of the pixel PXL may be used to convert image data so that a characteristic difference between the pixels PXL may be compensated. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. The first terminal of the third transistor T3 may be connected to an initialization power source. The third transistor T3 may be an initialization transistor capable of initializing the second node N2, and in case that a sensing control signal is supplied from the control line CLi, the third transistor T3 may be turned on to transmit a voltage of the initialization power source to the second node N2. Accordingly, a second storage electrode of the storage capacitor Cst connected to the second node N2 may be initialized.

A first storage electrode of the storage capacitor Cst may be connected to the first node N1, and the second storage electrode of the storage capacitor Cst may be connected to the second node N2. The storage capacitor Cst may be charged with a data voltage corresponding to the data signal supplied to the first node N1 during a frame period. Accordingly, the storage capacitor Cst may store a voltage corresponding to a difference between a voltage of the gate electrode of the first transistor T1 and a voltage of the second node N2.

In FIG. 4, an embodiment in which the light emitting elements LD configuring the light emitting unit EMU are all connected in parallel is illustrated, but the disclosure is not limited thereto. In some embodiments, the light emitting unit EMU may include at least one series stage including light emitting elements LD connected in parallel to each other. For example, the light emitting unit EMU may have a serial/parallel mixed structure.

FIG. 5 illustrates a schematic top plan view of the pixel PXL illustrated in FIG. 3.

In FIG. 5, for convenience of description, the transistors electrically connected to the light emitting elements LD and the signal lines electrically connected to the transistors are omitted.

In FIG. 5, for better comprehension and ease of description, a horizontal direction in a plan view is denoted as a first direction DR1, and a vertical direction in a plan view is denoted as a second direction DR2.

In FIG. 5, not only the constituent elements included in the pixel PXL are illustrated in FIG. 5 but also the area in which the constituent elements may be provided (or positioned) are comprehensively referred to as the pixel PXL.

Referring to FIG. 1 to FIG. 5, the pixel PXL may be positioned in a pixel area PXA disposed in the substrate SUB. The pixel area PXA may include an emission area EMA and a non-emission area NEMA.

The pixel PXL may include a bank BNK positioned in the non-emission area NEMA and light emitting elements LD positioned in the emission area EMA.

The bank BNK may be a structure that defines (or partitions) the pixel area PXA (or emission area EMA) of the pixel PXL and each of pixels adjacent thereto, and for example, may be a pixel defining film.

In an embodiment, the bank BNK may be a pixel defining film or a dam structure that defines each emission area EMA in which the light emitting elements LD should be supplied in a process of supplying (or injecting) light emitting elements LD to the pixel PXL. For example, the emission area of the pixel PXL may be partitioned by the bank BNK, so that a mixed solution (for example, ink) including a target amount and/or type of light emitting element LD may be supplied to (or injected into) the emission area EMA. The bank BNK may be a pixel defining film that finally defines each emission area EMA to which a color conversion layer is to be supplied during a process of supplying the color conversion layer (not shown) to the pixel PXL.

In some embodiments, the bank BNK may include at least one light blocking material and/or at least one reflective material (or scattering material) to prevent light leakage from occurring between the pixel PXL and pixels PXL adjacent thereto. In some embodiments, the bank BNK may include a transparent material (or substance). The transparent material may include, for example, a polyamides resin, a polyimide resin, and the like, but is not limited thereto. According to another embodiment, a reflective material layer may be separately provided and/or formed on the bank BNK to further improve an efficiency of light emitted from the pixel PXL.

At least one surface of the bank BNK may be surface-treated to have hydrophobicity. For example, the bank BNK may be surface-treated to have hydrophobicity by plasma before the light emitting elements LD are aligned, but the disclosure is not limited thereto.

The bank BNK may include at least one opening OP exposing components positioned thereunder in the pixel area PXA. For example, the bank BNK may include a first opening OP1 and a second opening OP2 exposing the components positioned under the bank BNK in the pixel area PXA. In an embodiment, the emission area EMA of the pixel PXL and the first opening OP1 of the bank BNK may correspond to each other.

In the pixel area PXA, the second opening OP2 may be positioned to be spaced apart from the first opening OP1, and may be positioned to be adjacent to a side, for example, an upper side, of the pixel area PXA. In an embodiment, the second opening OP2 may be an electrode separation area in which at least one alignment electrode ALE is separated from at least one alignment electrode ALE provided in the pixels PXL adjacent in the second direction DR2.

The pixel PXL may include pixel electrodes PE provided in at least the emission area EMA, light emitting elements LD electrically connected to the pixel electrodes PE, and a bank pattern BNKP and alignment electrodes ALE provided at positions corresponding to the pixel electrodes PE. For example, the pixel PXL may include first and second pixel electrodes PE1 and PE2, light emitting elements LD, first and second alignment electrodes ALE1 and ALE2, and first and second bank patterns BNKP1 and BNKP2, which may be provided in the emission area EMA. The number, shape, size, and arrangement of the pixel electrodes PE and/or the alignment electrodes ALE may be variously changed according to the structure of the pixel (PXL) (particularly, the light emitting unit EMU).

In an embodiment, the bank patterns BNKP, the alignment electrodes ALE, the light emitting elements LD, and the pixel electrodes PE may be sequentially provided based on a surface of the substrate SUB on which the pixel PXL may be provided, but the disclosure is not limited thereto. In some embodiments, the position and formation order of the electrode patterns configuring the pixel PXL (or the light emitting unit EMU) (or the light emitting part) may be variously changed. The stacked structure of the pixel PXL will be described later with reference to FIG. 6 to FIG. 10.

The bank patterns BNKP may be provided in the emission area EMA, may be spaced apart from each other in the first direction DR1 in the emission area EMA, and may respectively extend along the second direction DR2.

Each bank pattern BNKP (also referred to as a "wall pattern", "protruding pattern", or "supporting pattern") may have a uniform width in the emission area EMA. As an example, each of the first and second bank patterns BNKP1 and BNKP2 may have a bar-like shape having a constant width along a direction extending within the emission area EMA in a plan view, but the disclosure is not limited thereto. The first and second bank patterns BNKP1 and BNKP2 may have non-uniform widths in the extending direction, and may have at least two or more different widths in the extending direction.

The bank pattern BNKP may be a supporting member that supports each of the second alignment electrodes ALE1 and ALE2 for changing a surface profile (or shape) of each of the first and second alignment electrodes ALE1 and ALE2 so as to guide the light emitted from the light emitting elements LD in an image display direction of the display device.

The bank patterns BNKP may have the same width or different widths. For example, the first and second bank patterns BNKP1 and BNKP2 may have the same width or different widths in the first direction DR1 in the emission area EMA.

Each of the first and second bank patterns BNKP1 and BNKP2 may partially overlap at least one alignment electrode ALE in the emission area EMA. For example, the first bank pattern BNKP1 may be positioned under the first alignment electrode ALE1 so as to overlap an area of the first alignment electrode ALE1, and the second bank pattern BNKP2 may be positioned under the second alignment electrode ALE2 so as to overlap an area of the second alignment electrode ALE2.

As the bank patterns BNKP may be provided under an area of each of the alignment electrodes ALE in the emission area EMA, an area of each of the alignment electrodes ALE may protrude in an upper direction of the pixel PXL in the areas in which the bank patterns BNKP may be formed. Accordingly, a wall structure may be formed to be adjacent to the light emitting elements LD. For example, a wall structure may be formed in the emission area EMA so as to face the first and second ends EP1 and EP2 of the light emitting elements LD.

In an embodiment, in case that the bank patterns BNKP and/or alignment electrodes ALE include a reflective material, a reflective wall structure may be formed around the light emitting elements LD. Accordingly, as the light emitted from the light emitting elements LD may be directed in the upper direction of the pixel PXL (for example, the image display direction of the display device), the light efficiency of the pixel PXL may be further improved.

The alignment electrodes ALE may be positioned in the emission area EMA, may be spaced apart from each other along the first direction DR1 in the emission area EMA, and may respectively extend in the second direction DR2. The alignment electrodes ALE may be partially removed from the second opening OP2 of the bank BNK to be separated from the alignment electrodes ALE of adjacent pixels PXL in the second direction DR2.

In an embodiment, the alignment electrodes ALE may include the first alignment electrode ALE1 (or a first alignment wire) and the second alignment electrode ALE2 (or a second alignment wire) that are arranged to be spaced apart from each other in the first direction DR1.

After the light emitting elements LD are supplied and aligned in the pixel area PXA (or the emission area EMA) during the manufacturing process of the display device, at least one of the first and second alignment electrodes ALE1 and ALE2 may be separated from another electrode (for example, the alignment electrode ALE provided to each of the adjacent pixels PXL adjacent in the second direction DR2) in the second opening OP2 (or electrode separation area) of the bank BNK. For example, an end of the first alignment electrode ALE1 may be separated from the first alignment electrode ALE1 of the pixel PXL positioned above the corresponding pixel PXL in the second direction DR2 within the second opening OP2 of the bank BNK.

The first alignment electrode ALE1 may be electrically connected to the first transistor T1 described with reference to FIG. 4 through a first contact portion CNT1, and the second alignment electrode ALE2 may be electrically connected to the second power line PL2 described with reference to FIG. 4 through a second contact portion CNT2.

The first contact portion CNT1 may be formed by removing a portion of at least one insulating layer positioned between the first alignment electrode ALE1 and the first transistor T1, and the second contact portion CNT2 may be formed by removing a portion of at least one insulating layer positioned between the second alignment electrode ALE2 and the second power line PL2. The first contact portion CNT1 and the second contact portion CNT2 may be positioned in the non-emission area NEMA to overlap the bank BNK, but are not limited thereto. In some embodiments, the first and second contact portions CNT1 and CNT2 may be positioned in the second opening OP2 of the bank BNK, which may be an electrode separation area, or may be positioned in the emission area EMA.

The first alignment electrode ALE1 may be positioned on the first bank pattern BNKP1 in the emission area EMA to overlap the first bank pattern BNKP1. The second alignment electrode ALE2 may be positioned on the second bank pattern BNKP2 in the emission area EMA to overlap the second bank pattern BNKP2. As described above, each of the first and second alignment electrodes ALE1 and ALE2 may be provided and/or formed on the corresponding bank pattern BNKP to have a surface profile corresponding to a shape of the bank pattern BNKP disposed thereunder. Accordingly, the light emitted from the light emitting elements LD may be reflected by each of the first and second alignment electrodes ALE1 and ALE2 to further proceed in the image display direction of the display device. The bank pattern BNKP and the alignment electrodes ALE may be used as a reflective member that improves the light efficiency of the display device by guiding the light emitted from the light emitting elements LD in a desired direction. Accordingly, the light output efficiency of the light emitting elements LD in each pixel PXL may be improved.

Each of the first alignment electrode ALE1 and the second alignment electrode ALE2 may receive a signal (or alignment signal) from an alignment pad (not shown) positioned in the non-display area NDA in the alignment step of the light emitting elements LD. For example, the first alignment electrode ALE1 may receive a first alignment signal (or first alignment voltage) from a first alignment pad, and the second alignment electrode ALE2 may receive a second alignment signal (or second alignment voltage) from a second alignment pad. The above-described first and second alignment signals may be signals having a voltage difference and/or a phase difference so that light emitting elements LD may be aligned between the first and second alignment electrodes ALE1 and ALE2. At least one of the first and second alignment signals may be an AC signal, but the disclosure is not limited thereto.

Each alignment electrode ALE may be provided to have a bar-like shape having a constant width along the second direction DR2, but is not limited thereto. In some embodiments, each alignment electrode ALE may or may not have a bent portion in the second opening OP2 of the bank BNK, which is the non-emission area NEMA and/or the electrode separation area, and a shape and/or size thereof in a remaining area excluding the emission area EMA is not particularly limited and may be variously changed.

At least two or more light emitting elements LD may be aligned and/or provided in the emission area EMA (or the pixel area PXA). In some embodiments, the number of light emitting elements LD aligned and/or provided in the emission area EMA (or the pixel area PXA) may be variously changed.

The light emitting elements LD may be disposed between the first alignment electrode ALE1 and the second alignment electrode ALE2. Each of the light emitting elements LD may be the light emitting element LD described with reference to FIG. 1 and FIG. 2. Each of the light emitting elements LD may include the first end EP1 (or an end) and the second end EP2 (or another end) facing each other in the extending direction. In an embodiment, the second semiconductor layer 13 including a p-type semiconductor layer may be positioned at the first end EP1, and the first semiconductor layer 11 including an n-type semiconductor layer may be positioned at the second end EP2. The light emitting elements LD may be connected in parallel to each other between the first alignment electrode ALE1 and the second alignment electrode ALE2.

The light emitting elements LD may be disposed to be spaced apart from each other, and may be aligned substantially parallel to each other. A distance at which the light emitting elements LD may be spaced apart from each other is not particularly limited. In some embodiments, multiple light emitting elements LD may be disposed adjacent to each other to form a group, and other light emitting elements LD may be grouped in a state of being spaced apart from each other by a distance, and may have non-uniform density and may also be aligned in a direction.

Each of the light emitting elements LD may emit color light and/or white light. Each of the light emitting elements LD may be aligned between the first alignment electrode ALE1 and the second alignment electrode ALE2 so that a length direction thereof is parallel to the first direction DR1. In some embodiments, at least some of the light emitting elements LD may be aligned between the first alignment electrode ALE1 and the second alignment electrode ALE2 to not be completely parallel to the first direction DR1. For example, some of the light emitting elements LD may be aligned between the first alignment electrode ALE1 and the second alignment electrode ALE2 to be inclined in the first direction DR1. The light emitting elements LD may be provided in a form sprayed (or dispersed) in a solution, and may be injected (or supplied) into the pixel area PXA (or emission area EMA).

The light emitting elements LD may be injected (or supplied) into the pixel area PXA (or emission area EMA) through various methods including an inkjet printing method and a slit coating method. For example, the light emitting elements LD may be mixed with a volatile solvent and injected (or supplied) into the pixel area PXA through an inkjet printing method or a slit coating method. In case that an alignment signal corresponding to each of the first alignment electrode ALE1 and the second alignment electrode ALE2 is applied, an electric field may be formed between the first alignment electrode ALE1 and the second alignment electrode ALE2. Accordingly, the light emitting elements LD may be aligned between the first alignment electrode ALE1 and the second alignment electrode ALE2. After the light emitting elements LD are aligned, the light emitting elements LD may be stably aligned between the first and second alignment electrodes ALE1 and ALE2, by volatilizing the solvent or eliminating the solvent through another method.

Each of the light emitting elements LD may be an ultra-small light emitting diode using a material having an inorganic crystal structure, for example, having a size as small as nano-scale (or nanometer) or micro-scale (micrometer). For example, each of the light emitting elements LD may be the light emitting element LD described with reference to FIG. 1 and FIG. 2.

The pixel electrodes PE (or electrode) may be provided in the emission area EMA, and may be provided at positions corresponding to at least one alignment electrode ALE and at least one light emitting element LD, respectively. For example, each pixel electrode PE may be formed on each alignment electrode ALE and a corresponding light emitting element LD so as to overlap each alignment electrode ALE and the corresponding light emitting element LD to be electrically connected to the light emitting element LD.

The first pixel electrode PE1 ("first electrode" or "anode") may be formed on the first alignment electrode ALE1 and the first end EP1 of each of the light emitting elements LD to be electrically connected to the first end EP1 of each of the light emitting elements LD. The first pixel electrode PE1 may be in direct contact with the first alignment electrode ALE1 exposed by removing a portion of at least one insulating layer positioned between the first pixel electrode PE1 and the first alignment electrode ALE1 in the emission area EMA to be electrically and/or physically connected to the first alignment electrode ALE1. It has been described that a connection point (or contact point) of the first pixel electrode PE1 and the first alignment electrode ALE1 is positioned in the emission area EMA, but the disclosure is not limited thereto. In some embodiments, the connection point (or contact point) of the first pixel electrode PE1 and the first alignment electrode ALE1 may be positioned in the non-emission area NEMA, for example, the second opening OP2 of the bank BNK, which is an electrode separation area.

The first pixel electrode PE1 may have a bar-like shape extending along the second direction DR2, but is not limited thereto. In some embodiments, the shape of the first pixel electrode PE1 may be variously changed within a range in which it is electrically and/or physically stably connected to the first end EP1 of the light emitting elements LD. The shape of the first pixel electrode PE1 may be variously changed in consideration of the connection relationship with the first alignment electrode ALE1 disposed therebelow.

The second pixel electrode PE2 ("second electrode" or "cathode") may be formed on the second alignment electrode ALE2 and the second end EP2 of each of the light emitting elements LD to be electrically connected to the second end EP2 of each of the light emitting elements LD. The second pixel electrode PE2 may be in direct contact with the second alignment electrode ALE2 exposed by removing a portion of at least one insulating layer positioned between the second pixel electrode PE2 and the second alignment electrode ALE2 in the emission area EMA to be electrically and/or physically connected to the second alignment electrode ALE2. A connection point (or contact point) between the second pixel electrode PE2 and the second alignment electrode ALE2 may be positioned in the emission area EMA or the non-emission area NEMA.

The second pixel electrode PE2 may have a bar-like shape extending along the second direction DR2, but is not limited thereto. In some embodiments, the shape of the second pixel electrode PE2 may be variously changed within a range in which it is electrically and physically stably connected to the second end EP2 of the light emitting elements LD. The shape of the second pixel electrode PE2 may be variously changed in consideration of the connection relationship with the second alignment electrode ALE2 disposed therebelow.

In an embodiment, the pixel PXL may further include a pattern portion MAP. The pattern portion MAP may include a first pattern MAP1 and a second pattern MAP2.

The first pattern MAP1 may be positioned in the emission area EMA, and may overlap at least one area of the light emitting elements LD. The second pattern MAP2 may be positioned in the at least non-emission area NEMA, and may overlap the bank BNK.

The first and second patterns MAP1 and MAP2 may be inorganic films (or inorganic insulating films) containing inorganic materials. As an example, the first and second patterns MAP1 and MAP2 may include at least one of a silicon nitride ($SiN_x$), a silicon oxide ($SiO_x$), and a silicon oxynitride ($SiO_xN_y$). However, the materials of the first and second patterns MAP1 and MAP2 are not limited to the above-described embodiment. For example, the first and second patterns MAP1 and MAP2 may be made of a transparent conductive oxide such as an indium tin oxide (ITO) and an indium zinc oxide (IZO), a metal, or the like. In an embodiment, the first and second patterns MAP1 and MAP2 may be formed by selecting a suitable material within a range that may be completely electrically separated (or insulated) from the first pixel electrode PE1 and the second pixel electrode PE2.

In a plan view, the first and second patterns MAP1 and MAP2 may not overlap the first and second pixel electrodes PE1 and PE2, and may be positioned within the pixel area PXA to be adjacent to an edge of each of the first and second pixel electrodes PE1 and PE2. For example, the first pattern MAP1 may be positioned between the first pixel electrode PE1 and the second pixel electrode PE2 in the emission area EMA and may not overlap the first and second pixel electrodes PE1 and PE2. The second pattern MAP2 may be positioned adjacent to the edge of each of the first and second pixel electrodes PE1 and PE2 in the at least non-emission area NEMA.

Hereinafter, a stacked structure of the pixel PXL according to the above-described embodiment will be described with reference to FIG. 6 to FIG. 10.

FIG. 6 illustrates a schematic cross-sectional view taken along line I-I' of FIG. 5, FIG. 7 illustrates a schematically enlarged cross-sectional view of portion EA of FIG. 6, and FIG. 8 to FIG. 10 illustrate schematic cross-sectional views taken along line II-II' of FIG. 5.

In describing embodiments, "formed and/or provided in the same layer" may mean that it is formed in the same process, and "formed and/or provided in a different layer" may mean that it is formed in different processes.

FIG. 9 illustrates a modified embodiment with respect to an embodiment of FIG. 8 in relation to the bank pattern BNKP and the like.

FIG. 10 illustrates a modified embodiment with respect to an embodiment of FIG. 8 in relation to a light conversion pattern LCP and the like. For example, FIG. 8 illustrates an embodiment in which a color conversion layer CCL and a color filter CF may be directly formed on a coating layer CTL, and FIG. 10 illustrates an embodiment in which an upper substrate including the light conversion pattern LCP may be positioned on a display element layer DPL through an adhesion process using an adhesive layer.

In FIG. 6 to FIG. 10, each electrode may be illustrated only as an electrode of a single film (or single layer), and each insulating layer may be shown only as an insulating layer of a single film (or single layer), for simplifying a pixel PXL, but the disclosure is not limited thereto.

In FIG. 6 to FIG. 10, a vertical direction ("vertical direction" or "thickness direction of the substrate SUB") in a cross-sectional view is denoted as a third direction DR3.

Referring to FIG. 1 to FIG. 10, the pixel PXL may include the substrate SUB, a pixel circuit layer PCL, and a display element layer DPL.

The pixel circuit layer PCL and the display element layer DPL may be disposed to overlap each other on a surface of the substrate SUB. For example, the display area DA of the substrate SUB may include the pixel circuit layer PCL disposed on a surface of the substrate SUB, and the display element layer DPL disposed on the pixel circuit layer PCL. However, mutual positions of the pixel circuit layer PCL and the display element layer DPL on the substrate SUB may be changed according to embodiments. In case that the pixel circuit layer PCL and the display element layer DPL are separated as separate layers and overlap each other, respective layout spaces for forming the pixel circuit PXC and the light emitting unit EMU in a plan view may be sufficiently secured.

The substrate SUB may include a transparent insulating material to transmit light. The substrate SUB may be a rigid substrate or a flexible substrate.

For example, the rigid substrate may be a glass substrate, a quartz substrate, a glass ceramic substrate, and/or a crystalline glass substrate.

The flexible substrate may be a film substrate or a plastic substrate, which may include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (for example, transistors T) configuring the pixel circuit PXC of the corresponding pixel PXL and specific signal lines electrically connected to the circuit elements may be disposed. The alignment electrode ALE, the light emitting elements LD, and/or the pixel electrodes PE configuring the light emitting unit EMU of the corresponding pixel PXL may be disposed in each pixel area PXA of the display element layer DPL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer VIA that may be sequentially stacked on each other on the substrate SUB along the third direction DR3.

The buffer layer BFL may prevent impurities from being diffused into the transistor T included in the pixel circuit PXC. The buffer layer BFL may be an inorganic film including an inorganic material. The buffer layer BFL may include at least one of metal oxides such as a silicon nitride $(SiN_x)$, a silicon oxide $(SiO_x)$, a silicon oxynitride $(SiO_xN_y)$, and an aluminum oxide $(AlO_x)$. The buffer layer BFL may be provided as a single layer, but may also be provided as a multilayer of at least a double layer or more. In case that the buffer layer BFL is provided as multiple layers, respective layers thereof may be made of the same material or different materials. The buffer layer BFL may be omitted depending on the material, a process condition, and the like of the substrate SUB.

The pixel circuit PXC may include at least one transistor T. For convenience of description, FIG. 6 illustrates a transistor T for controlling a driving current of the light emitting element LD. The transistor T may be the first transistor T1 described with reference to FIG. 4.

The transistor T may include a semiconductor pattern and a gate electrode GE overlapping at least a portion (or an area) of the semiconductor pattern. Here, the semiconductor pattern may include an active pattern ACT, a first contact area SE, and a second contact area DE. The first contact area SE may be a source area, and the second contact area DE may be a drain area.

The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) and/or silver (Ag), which may be a low-resistance material.

The gate insulating layer GI may be entirely provided and/or formed on the semiconductor pattern and buffer layer BFL. The gate insulating layer GI may be an inorganic film including an inorganic material. For example, the gate insulating layer GI may include at least one of metal oxides such as a silicon nitride $(SiN_x)$, a silicon oxide $(SiO_x)$, a silicon oxynitride $(SiO_xN_y)$, and an aluminum oxide $(AlO_x)$. However, the material of the gate insulating layer GI is not limited to the above-described embodiments. In some embodiments, the gate insulating layer GI may be formed as an organic film (or organic insulating film) including an organic material. The gate insulating layer GI may be provided as a single layer, and may be provided as a multilayer of at least a double layer or more.

The active pattern ACT, the first contact area SE, and the second contact area DE may be semiconductor patterns made of a polysilicon, an amorphous silicon, an oxide semiconductor, or the like. The active pattern ACT, the first contact area SE, and the second contact area DE may be formed of a semiconductor layer in which an impurity is not doped or an impurity is doped. For example, the first contact area SE and the second contact area DE may be formed of a semiconductor layer doped with an impurity, and the active pattern ACT may be formed of a semiconductor layer that is not doped with an impurity. As the impurity, for example, an n-type impurity may be used, but the disclosure is not limited thereto.

The active pattern ACT may be a channel area that is an area overlapping the gate electrode GE of the corresponding transistor T. For example, the active pattern ACT of the transistor T may overlap the gate electrode GE of the transistor T to form the channel area of the transistor T.

The first contact area SE of the transistor T may be connected to (or may contact) an end of the active pattern ACT. The first contact area SE of the transistor T may be connected to a bridge pattern BRP through a first connection member TE1.

The first connection member TE1 may be provided and/or formed on the interlayer insulating layer ILD. An end of the first connection member TE1 may be electrically and/or physically connected to the first contact area SE of the first transistor T1 through a contact hole sequentially penetrating the interlayer insulating layer ILD and the gate insulating layer GI. Another end of the first connection member TE1 may be electrically and/or physically connected to the bridge pattern BRP through a contact hole penetrating the passivation layer PSV positioned on the interlayer insulating layer ILD. The first connection member TE1 may include the same material as that of the gate electrode GE, or may include one or more materials selected from the materials illustrated as constituent materials of the gate electrode GE.

The interlayer insulating layer ILD may be entirely provided and/or formed on the gate electrode GE and the gate insulating layer GI. The interlayer insulating layer ILD may include the same material as that of the gate insulating layer GI, or may include one or more materials selected from the materials illustrated as constituent materials of the gate insulating layer GI.

The bridge pattern BRP may be provided and/or formed on the passivation layer PSV. An end of the bridge pattern BRP may be connected to the first contact area SE of the transistor T through the first connection member TE1. Another end of the bridge pattern BRP may be electrically and/or physically connected to a bottom metal layer BML through a contact hole that sequentially penetrates the passivation layer PSV, the interlayer insulating layer ILD, the gate insulating layer GI, and the buffer layer BFL. The bottom metal layer BML and the first contact area SE of the transistor T may be electrically connected through the bridge pattern BRP and the first connection member TE1.

The bottom metal layer BML may be a first conductive layer among the conductive layers disposed on the substrate SUB. For example, the bottom metal layer BML may be the first conductive layer positioned between the substrate SUB and the buffer layer BFL. The bottom metal layer BML may be electrically connected to the transistor T to extend a driving range of a voltage supplied to the gate electrode GE of the transistor T. For example, the bottom metal layer BML may be electrically connected to the first contact area SE of the transistor T to stabilize the channel area of the transistor T. As the bottom metal layer BML may be electrically connected to the first contact area SE of the transistor T, floating of the bottom metal layer BML may be prevented.

The second contact area DE of the transistor T may be connected to (or contact) another end of the active pattern ACT. The second contact area DE of the transistor T may be connected to (or contact) a second connection member TE2.

The second connection member TE2 may be provided and/or formed on the interlayer insulating layer ILD. An end of the second connection member TE2 may be electrically and/or physically connected to the second contact area DE of the transistor T through a contact hole penetrating the interlayer insulating layer ILD and the gate insulating layer GI. Another end of the second connection member TE2 may be electrically and/or physically connected to the first alignment electrode ALE1 of the display element layer DPL through the first contact portion CNT1 sequentially penetrating the via layer VIA and the passivation layer PSV. In an embodiment, the second connection member TE2 may be a medium for connecting the transistor T of the pixel circuit layer PCL and the first alignment electrode ALE1 of the display element layer DPL.

The interlayer insulating layer ILD may be provided and/or formed on the above-described transistor T.

In the above-described embodiment, the case in which the transistor T is a thin film transistor having a top gate structure is described as an example, but the disclosure is not limited thereto, and the structure of the transistor T may be variously changed.

The passivation layer PSV may be provided and/or formed on the transistor T and the first and second connection members TE1 and TE2.

The passivation layer PSV (or protective layer) may be entirely provided and/or formed on the first and second connection members TE1 and TE2 and the interlayer insulating layer ILD. The passivation layer PSV may be an inorganic film (or an inorganic insulating film) including an inorganic material or an organic film (or an organic insulating film) including an organic material. The inorganic film may include, for example, at least one of metal oxides such as a silicon oxide ($SiO_x$), a silicon nitride ($SiN_x$), a silicon oxynitride ($SiO_xN_y$), and an aluminum oxide ($AlO_x$). The organic film may be, for example, at least one of a poly-acrylates resin, an epoxy resin, a phenolic resin, a poly-amides resin, a polyimides resin, an unsaturated polyesters resin, a poly-phenylen ethers resin, a poly-phenylene sulfides resin, and a benzocyclobutene resin. The passivation layer PSV may be partially opened to include the first contact portion CNT1 exposing an area of the second connection member TE2. The passivation layer PSV may be partially opened to expose an area of the first connection member TE1 and an area of the bottom metal layer BML.

In some embodiments, the passivation layer PSV may include the same material as the interlayer insulating layer ILD, but is not limited thereto. The passivation layer PSV may be provided as a single layer, but may also be provided as a multilayer of at least a double layer or more.

The pixel circuit layer PCL may include a power line provided and/or formed on the passivation layer PSV. For example, the power line may include the second power line PL2. The second power line PL2 may be disposed on the same layer as the bridge pattern BRP. A voltage of the second driving power source VSS may be applied to the second power line PL2. Although not directly shown in FIG. 6 to FIG. 10, the pixel circuit layer PCL may further include the first power line PL1 described with reference to FIG. 4. The first power line PL1 may be disposed on the same layer as the second power line PL2, or may be disposed on a different layer from the second power line PL2. In the above-described embodiment, it has been described that the second power line PL2 is provided and/or formed on the passivation layer PSV, but the disclosure is not limited thereto. In some embodiments, the second power line PL2 may be disposed on an insulating layer on which an of the conductive layers provided in the pixel circuit layer PCL may be positioned. For example, the position of the second power line PL2 in the pixel circuit layer PCL may be variously changed.

The second power line PL2 may include a conductive material (or substance). For example, the second power line PL2 may be formed to have a single layer (or single film) structure of a single or a mixture thereof selected from copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double layer (or double film) or multilayer (or multifilm) structure of molybdenum (Mo), titanium (Ti), copper (Cu), aluminum (Al) and/or silver (Ag), which may be a low-resistance material. For example, the second power line PL2 may be formed of a double layer (or double film) stacked in an order of titanium (Ti)/copper (Cu).

The via layer VIA may be provided and/or formed on the bridge pattern BRP and the second power line PL2.

The via layer VIA may be entirely provided and/or formed on the bridge pattern BRP, the second power line PL2, and the passivation layer PSV. The via layer VIA may be configured as a single layer including an organic film or a multilayer including a double layer or more. In some embodiments, the via layer VIA may be provided in a form including an inorganic film and an organic film disposed on the inorganic film. In case that the via layer VIA is provided as a multilayer, an organic film configuring the via layer VIA may be positioned on an uppermost layer of the via layer VIA. The via layer VIA may be at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin.

The via layer VIA may include the first contact portion CNT1 corresponding to the first contact portion CNT1 of the passivation layer PSV exposing the second connection member TE2 electrically connected to the transistor T, and the second contact portion CNT2 exposing the second power line PL2. In an embodiment, the via layer VIA may be used as a planarization layer for alleviating a step formed by the components (for example, the transistors T, the power lines, the bridge pattern BRP, etc.) positioned thereunder in the pixel circuit layer PCL.

The display element layer DPL may be provided and/or formed on the via layer VIA.

The display element layer DPL may include the bank patterns BNKP, the alignment electrodes ALE, the bank BNK, the light emitting elements LD, and the pixel electrodes PE. The display element layer DPL may include at least one insulating layer positioned between the above-described components. As an example, the display element layer DPL may include a first insulating layer INS1 and a second insulating layer INS2.

The bank patterns BNKP may be provided and/or formed on the via layer VIA.

The bank patterns BNKP may protrude in the third direction DR3 on a surface of the via layer VIA. Accordingly, an area of the alignment electrodes ALE disposed on the bank patterns BNKP may protrude in the third direction DR3 (or the thickness direction of the substrate SUB).

The bank patterns BNKP may be inorganic films containing inorganic materials or organic films containing organic materials. In some embodiments, the bank patterns BNKP may include a single layer of organic film and/or a single layer of inorganic film, but is not limited thereto. In some embodiments, the bank patterns BNKP may be provided to have a multi-filmed structure in which at least one organic film and at least one inorganic film may stacked on each other. However, the material of the bank patterns BNKP is not limited to the above-described example, and in some embodiments, the bank patterns BNKP may include a conductive material (or substance).

The bank patterns BNKP may have cross-sections of a trapezoidal shape of which width may be narrowed from a surface (for example, an upper surface) of the via layer VIA toward an upper portion thereof along the third direction DR3, but is not limited thereto. In some embodiments, the bank patterns BNKP, as shown in FIG. 9, may include a curved surface having a cross section of a semi-elliptic shape or a semi-circular shape (or semi-spherical shape) of which width may be narrowed from a surface of the via layer VIA toward an upper portion thereof along the third direction DR3. When viewed in a cross-sectional view, the shapes of the bank patterns BNKP are not limited to the above-described embodiment, and the shapes thereof may be variously changed within a range in which the first to fourth bank patterns may improve efficiency of light emitted from each of the light emitting elements LD. In some embodiments, at least one of the bank patterns BNKP may be omitted, or the position thereof may be changed.

In an embodiment, the bank patterns BNKP may be utilized as reflective members. As an example, the bank patterns BNKP may be used as members that guide the light emitted from each light emitting element LD in a desired direction together with the alignment electrodes ALE disposed thereon to improve the light output efficiency of the pixel PXL.

The alignment electrodes ALE may be provided and/or formed on the bank patterns BNKP.

The alignment electrodes ALE may be provided and/or formed on the via layer VIA and the bank patterns BNKP. The alignment electrodes ALE may be disposed on the same plane, and may have the same thickness in the third direction DR3. For example, the first alignment electrode ALE1 and the second alignment electrode ALE2 may be disposed on the via layer VIA and the corresponding bank pattern BNKP, and may have the same thickness in the third direction DR3. The first alignment electrode ALE1 and the second alignment electrode ALE2 may be simultaneously formed in the same process.

The first alignment electrode ALE1 may have a shape corresponding to an inclination of the first bank pattern BNKP1 positioned therebelow, and the second alignment electrode ALE2 may have a shape corresponding to an inclination of the second bank pattern BNKP2 positioned therebelow.

The alignment electrodes ALE may be made of a material having a constant (or uniform) reflectance in order to allow the light emitted from the light emitting elements LD to proceed in the image display direction of the display device. For example, the alignment electrodes ALE may be made of a conductive material (or substance). The conductive material may include an opaque metal that is advantageous for reflecting light emitted by the light emitting elements LD in the image display direction of the display device. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof, or a combination thereof. However, the material of the alignment electrodes ALE is not limited to the above-described embodiment. In some embodiments, the alignment electrodes ALE may also include a transparent conductive material (or substance). The transparent conductive material (or substance) may include a conductive oxide such as an indium tin oxide (ITO), an indium zinc oxide (IZO), a zinc oxide (ZnOx), an indium gallium zinc oxide (IGZO), and an indium tin zinc oxide (ITZO), and a conductive polymer such as poly(3,4-ethylenedioxythiophene) (PEDOT), or a combination thereof. In case that the alignment electrodes ALE include the transparent conductive material (or substance), a separate conductive layer made of an opaque metal may also be added to reflect the light emitted from the light-emitting elements LD in the image display direction of the display device. However, the material of the alignment electrodes ALE is not limited to the above-described materials.

Each of the alignment electrodes ALE may be provided and/or formed as a single layer, but is not limited thereto. In some embodiments, each of the alignment electrodes ALE may be provided and/or formed as a multi-layered layer in which at least two or more of metals, alloys, conductive oxides, and conductive polymers are stacked on each other. Each of the alignment electrodes ALE may be formed as a multilayer of at least a double layer or more in order to minimize distortion due to signal delay in case that a signal (or voltage) is transmitted to both ends EP1 and EP2 of each of the light emitting elements LD. For example, each of the alignment electrodes ALE may be formed as a multilayer selectively further including at least one of at least one reflective electrode layer, at least one transparent electrode layer disposed above and/or below the reflective electrode layer, and at least one conductive capping layer covering upper portions of the reflective electrode layer and/or the transparent electrode layer.

As described above, in case that the alignment electrodes ALE are made of a conductive material with constant reflectivity, it may be possible to allow the light emitted from both ends of each of the light emitting elements LD, that is, from the first and second ends EP1 and EP2 to further proceed in the image display direction (or third direction DR3) of the display device. Particularly, in case that the alignment electrodes ALE have an inclined surface or a curved surface corresponding to the shape of the bank pattern BNKP and are disposed to face the first and second ends EP1 and EP2 of the light emitting elements LD, light emitted from the first and second ends EP1 and EP2 of each of the light emitting elements LD may be reflected by the alignment electrodes ALE and further proceed in the image display direction of the display device. Therefore, the efficiency of light emitted from the light emitting elements LD may be improved.

The first alignment electrode ALE1 may be electrically connected to the first transistor T1 of the pixel circuit layer PCL through the first contact portion CNT1, and the second alignment electrode ALE2 may be electrically connected to the second power line PL2 of the pixel circuit layer PCL through the second contact portion CNT2.

The first insulating layer INS1 may be provided and/or formed on the alignment electrodes ALE.

The first insulating layer INS1 may include an inorganic film made of an inorganic material or an organic film made of an organic material. The first insulating layer INS1 may be formed as an inorganic film that is advantageous for protecting the light emitting elements LD from the pixel circuit layer PCL. For example, the first insulating layer INS1 may include at least one of metal oxides such as a silicon nitride ($SiN_x$), a silicon oxide ($SiO_x$), a silicon oxynitride ($SiO_xN_y$), and an aluminum oxide ($AlO_x$), but is not limited thereto.

The first insulating layer INS1 may be provided as a single layer or a multilayer. In case that the first insulating layer INS1 is provided as a multilayer, the first insulating layer INS1 may be provided in a distributed Bragg reflector structure in which a first layer and a second layer having different refractive indexes and configured of inorganic films are alternately stacked on each other. For example, the first insulating layer INS1 may be provided in a structure in which a first layer having a small refractive index and a second layer having a larger refractive index than that of the first layer are alternately stacked on each other. As described above, in case that the first insulating layer INS1 is provided as a multilayer, the first insulating layer INS1 may be used as a reflective member that reflects light emitted from the light emitting elements LD in a target direction by using reinforcing interference due to a difference in refractive index between the first layer and the second layer. Each of the first and second layers may include at least one of a silicon oxide ($SiO_x$), a silicon nitride ($SiN_x$), a silicon oxynitride ($SiO_xN_y$), a silicon oxycarbide ($SiO_xC_y$), a silicon carbonitride ($SiC_xN_y$), a silicon oxycarbide ($SiO_xC_y$), an aluminum oxide ($AlO_x$), an aluminum nitride ($AlN_x$), a hafnium oxide ($HfO_x$), a zirconium oxide ($ZrO_x$), a titanium oxide ($TiO_x$), and a tantalum oxide ($TaO_x$).

The first insulating layer INS1 may be partially opened to expose components positioned thereunder in an area of the emission area EMA. For example, an area of the first insulating layer INS1 may be removed from the emission area EMA, so that the first insulating layer INS1 may be partially opened to expose a portion of the first alignment electrode ALE1 on the first bank pattern BNKP1 and a portion of the second alignment electrode ALE2 on the second bank pattern BNKP2.

The bank BNK may be provided and/or formed on the first insulating layer INS1.

The bank BNK may be formed between adjacent pixels PXL to surround the emission area EMA of the pixel PXL to configure a pixel defining film partitioning the emission area EMA of the corresponding pixel PXL. In a process of supplying the light emitting elements LD to the emission area EMA, the bank BNK may be a dam structure that prevents a solution mixed with the light emitting elements LD from flowing into the emission area EMA of the adjacent pixel PXL, or controls an amount of solution to be supplied to each emission area EMA.

In the emission area EMA of the pixel PXL in which the first insulating layer INS1 and the bank BNK may be formed, the light emitting elements LD may be supplied and aligned. For example, the light emitting elements LD may be supplied (or input) to the emission area EMA through an inkjet printing method or the like, and the light emitting elements LD may be aligned between the alignment electrodes ALE by an electric field formed by a signal (or an alignment signal) applied to each of the alignment electrodes ALE. For example, the light emitting elements LD may be aligned on the first insulating layer INS1 between the first alignment electrode ALE1 on the first bank pattern BNKP1 and the second alignment electrode ALE2 on the second bank pattern BNKP2.

Each of the light emitting elements LD may include, as shown in FIG. 7, a light emitting stacked body (or light emitting stacked pattern) including a first semiconductor layer 11, an active layer 12, and a second semiconductor layer 13 sequentially stacked on each other in a direction perpendicular to the third direction DR3. Each of the light emitting elements LD may include an insulating film 14 covering an outer circumferential surface of the light emitting stacked body. The second semiconductor layer 13 may be positioned at the first end EP1 of each light emitting element LD, and the first semiconductor layer 11 may be positioned at the second end EP2 of the corresponding light emitting element LD.

The second insulating layer INS2 (or insulating pattern) may be provided and/or formed on the light emitting elements LD and the bank BNK. For example, the second insulating layer INS2 may be positioned on the light emitting elements LD in the emission area EMA, and may be positioned on the bank BNK in the non-emission area NEMA. In the following embodiment, for convenience of description, the second insulating layer INS2 positioned in the emission area EMA is referred to as a (2-1)-th insulating layer INS2, and the second insulating layer INS2 positioned in the non-emission area NEMA is referred to as a (2-2)-th insulating layer INS2. When the (2-1)-th insulating layer INS2 and the (2-2)-th insulating layer INS2 are comprehensively named, they are referred to as the second insulating layer INS2.

The (2-1)-th insulating layer INS2 may be provided and/or formed on the light emitting elements LD to partially cover an outer circumferential surface (or a surface) of each of the light emitting elements LD, and may expose the first end EP1 and the second end EP2 of each of the light emitting elements LD to the outside.

The (2-2)-th insulating layer INS2 may be provided and/or formed on the bank BNK to partially cover the bank BNK. In some embodiments, the (2-2)-th insulating layer INS2 may be optionally provided.

The second insulating layer INS2 may be configured as a single layer or multilayer, and may include an inorganic film including at least one inorganic material or an organic film including at least one organic material. The second insulating layer INS2 may include an inorganic film that is advantageous for protecting the active layer 12 of each of the light emitting elements LD from external oxygen and moisture. However, the disclosure n is not limited thereto, and the second insulating layer INS2 may be formed of an organic film including an organic material according to design conditions of the display device to which the light emitting elements LD are applied. After the alignment of the light emitting elements LD may be completed in the pixel area PXA (or emission area EMA) of the pixel PXL, the second insulating layer INS2 may be formed on the light emitting elements LD, so that it is possible to prevent the light emitting elements LD from deviating from the aligned position.

In case that there is a gap (or space) between the first insulating layer INS1 and the light emitting elements LD before the second insulating layer INS2 is formed, the gap may be filled with the second insulating layer INS2 in the process of forming the second insulating layer INS2. The second insulating layer INS2 may be configured as an organic film that may be advantageous for filling the gap between the first insulating layer INS1 and the light emitting elements LD.

In the emission area EMA, the second insulating layer INS2 may include a first surface SF1 in contact with the light emitting element LD and a second surface SF2 in contact with the first pattern MAP1. The first surface SF1 and the second surface SF2 may face each other in the third direction DR3.

The first surface SF1 may be a surface (or a lower surface) of the second insulating layer INS2 in direct contact with the insulating film 14 of the light emitting element LD, and the second surface SF2 may be another surface (or an upper side) of the second insulating layer INS2 in direct contact with the first pattern MAP1.

The second insulating layer INS2 may be positioned between the first surface SF1 and the second surface SF2 to include both side surfaces connecting the first surface SF1 and the second surface SF2. The side surfaces of the second insulating layer INS2 may be in contact with the pixel electrode PE.

The pattern portion MAP may be provided and/or formed on the second insulating layer INS2. For example, the first pattern MAP1 may be provided and/or formed on the (2-1)-th insulating layer INS2, and the second pattern MAP2 may be provided and/or formed on the (2-2)-th insulating layer INS2.

The first pattern MAP1 may be positioned on the (2-1)-th insulating layer INS2 to be in contact with the second surface SF2 of the (2-1)-th insulating layer INS2. The second pattern MAP2 may be positioned on the (2-2)-th insulating layer INS2 to be in contact with a surface of the (2-2)-th insulating layer INS2.

The first pattern MAP1 and the second pattern MAP2 may be a mask pattern used as a mask during the process of forming the second insulating layer INS2. The first and second patterns MAP1 and MAP2 may be inorganic films (or inorganic insulating patterns) including inorganic materials.

In an embodiment, the first pattern MAP1 may have the same or different planar shape as the (2-1)-th insulating layer INS2, and the second pattern MAP2 may have the same or different planar shape as the (2-2)-th insulating layer INS2.

The pixel electrodes PE may be disposed on both side surfaces of the first insulating layer INS1, the light emitting elements LD, and the (2-1)-th insulating layer INS2 on the light emitting elements LD in the emission area EMA.

In the emission area EMA, the first pixel electrode PE1 may be disposed on the first end EP1 of each of the light emitting elements LD, a side surface of the (2-1) insulating layer INS2 on the corresponding light emitting element LD, and the first insulating layer INS1. The first pixel electrode PE1 may contact the first alignment electrode ALE1 by the partially opened first insulating layer INS1 to be electrically connected thereto.

In the emission area EMA, the second pixel electrode PE2 may be disposed on the second end EP2 of each of the light emitting elements LD, another side surface of the (2-1) insulating layer INS2 on the corresponding light emitting element LD, and the first insulating layer INS1. The second pixel electrode PE2 may contact the second alignment electrode ALE2 by the partially opened first insulating layer INS1 to be electrically connected thereto.

The first pixel electrode PE1 and the second pixel electrode PE2 may be disposed to be spaced apart from each other on the (2-1)-th insulating layer INS2 on the light emitting elements LD.

The first pixel electrode PE1 and the second pixel electrode PE2 may be made of various transparent conductive materials so that the light emitted from each of the light emitting elements LD may proceed in the image display direction of the display device (for example, third direction DR3) without loss. For example, the first pixel electrode PE1 and the second pixel electrode PE2 may be at least one of various transparent conductive materials (or substances) such as an indium tin oxide (ITO), an indium zinc oxide (IZO), a zinc oxide (ZnO X), an indium gallium zinc oxide (IGZO), and an indium tin zinc oxide (ITZO), and may be formed to be substantially transparent or translucent to satisfy a light transmittance (or transmittance). However, the materials of the first pixel electrode PE1 and the second pixel electrode PE2 are not limited to the above-described embodiment. In some embodiments, the first pixel electrode PE1 and the second pixel electrode PE2 may be made of various opaque conductive materials (or substances). The first pixel electrode PE1 and the second pixel electrode PE2 may be formed as a single layer or a multilayer.

In an embodiment, the first pixel electrode PE1 and the second pixel electrode PE2 may be provided and/or formed on the same layer. For example, the first pixel electrode PE1 and the second pixel electrode PE2 may be disposed on the same plane, and may be electrically separated (or insulated) by being spaced apart from each other by a distance on the (2-1)-th insulating layer INS2. The first pixel electrode PE1 may be positioned on a side surface of the (2-1)-th insulating layer INS2 to overlap a side surface of the (2-1)-th insulating layer INS2, and the second pixel electrode PE2 may be positioned on another side surface of the (2-1)-th insulating layer INS2 to overlap another side surface of the (2-1)-th insulating layer INS2.

The coating layer CTL may be provided and/or formed on the first pixel electrode PE1 and the second pixel electrode PE2.

The coating layer CTL may include an organic film including an organic material. The coating layer CTL may include a transparent organic film in order to minimize loss of the light emitted from the light emitting elements LD to proceed in the image display direction of the display device. For example, the coating layer CTL may be an organic film including at least one of an acryl-based resin, a polyimide-based resin, and a siloxane-based resin. In an embodiment, the coating layer CTL may be cured by light or heat.

The coating layer CTL may be a planarization layer that is positioned on the first and second pixel electrodes PE1 and PE2 in the emission area EMA and reduces a step due to the components positioned thereunder. The coating layer CTL may have a flat surface UF. In some embodiments, the coating layer CTL may be entirely positioned on the pixel area PXA. As an example, the coating layer CTL may be positioned on the components (for example, the first and second pixel electrodes PE1 and PE2, and the bank BNK) entirely positioned below the emission area EMA and the non-emission area NEMA.

In an embodiment, a side surface of the (2-1)-th insulating layer INS2 may be in contact with the first pixel electrode PE1, another side surface of the (2-1)-th insulating layer INS2 may be in contact with the second pixel electrode PE2, and the first surface SF1 of the (2-1)-th insulating layer INS2 may be in contact with the light emitting element LD, and the second surface SF2 of the (2-1)-th insulating layer INS2 may be in contact with the first pattern MAP1. For example, the (2-1)-th insulating layer INS2 may be surrounded by the light emitting element LD, the first pixel electrode PE1, the second pixel electrode PE2, and the first pattern MAP1.

As described above, the (2-1)-th insulating layer INS2 may be surrounded by the light emitting element LD, the first and second pixel electrodes PE1 and PE2, and the light emitting element LD, so the coating layer CTL may not directly contact the (2-1)-th insulating layer INS2.

In the process of forming the first and second pixel electrodes PE1 and PE2, a portion of the material layer configuring the coating layer CTL may be removed to expose a portion of the conductive layer configuring the first and second pixel electrodes PE1 and PE2. The first pixel electrode PE1 and the second pixel electrode PE2 may be simultaneously formed by removing the exposed conductive layer by performing an etching process. Since a portion of the conductive layer exposed to the outside of the coating layer CTL may be removed to form the first and second pixel electrodes PE1, and PE2, at least one area (A) of the first pixel electrode PE1 and at least one area (B) of the second pixel electrode PE2 may be colinear (or on the same plane) as the surface UF of the coating layer CTL.

Another insulating layer (for example, a third insulating layer) may be selectively disposed on the coating layer CTL and the second pattern MAP2.

A dummy bank D_BNK may be provided and/or formed on the second pattern MAP2. In some embodiments, in case that the third insulating layer is disposed on the second pattern MAP2, the dummy bank D_BNK may be provided and/or formed on the third insulating layer on the second pattern MAP2.

The dummy bank D_BNK may be positioned on the second pattern MAP2 on the bank BNK to implement a dam portion DAM (or dam structure) together with the bank BNK. The dam portion DAM may be a structure that finally defines the emission area EMA from which light is emitted from the pixel PXL. In an embodiment, the dam portion DAM is a structure that finally defines the emission area EMA to which the color conversion layer CCL is to be supplied in the process of supplying the color conversion layer CCL to the pixel area PXA. For example, the emission area EMA of the pixel PXL may be finally partitioned by the dam portion DAM, so that a desired amount and/or type of color conversion layer CCL may be supplied (input) to the emission area EMA.

The dummy bank D_BNK may include a light blocking material. For example, the dummy bank D_BNK may be a black matrix. In some embodiments, the dummy bank D_BNK may include at least one light blocking material and/or reflective material to further direct the light emitted from the light emitting elements LD in the image display direction (or third direction DR3) of the display device, thereby improving the light output efficiency of the light emitting elements LD.

The color conversion layer CCL may be provided and/or formed on the coating layer CTL in the emission area EMA. In some embodiments, in case that the third insulating layer is disposed on the coating layer CTL, the color conversion layer CCL may be provided and/or formed on the third insulating layer on the coating layer CTL.

The color conversion layer CCL may be positioned on the coating layer CTL in the emission area EMA of the pixel PXL surrounded by the bank BNK and the dummy bank D_BNK. For example, the color conversion layer CCL may be directly positioned on the coating layer CTL to contact the flat surface UF of the coating layer CTL.

The color conversion layer CCL may include color conversion particles QD corresponding to a specific color. For example, the color conversion layer CCL may include the color conversion particles QD that convert light of a first color emitted from the light emitting elements LD into light of a second color (or a specific color). In case that the pixel PXL is a red pixel (or red sub-pixel), the color conversion layer CCL of the corresponding pixel PXL may include the color conversion particles QD of red quantum dots that convert the light of the first color emitted from the light emitting elements LD into the light of the second color, for example, light of a red color. In case that the pixel PXL is a green pixel (or green sub-pixel), the color conversion layer CCL of the corresponding pixel PXL may include the color conversion particles QD of green quantum dots that convert the light of the first color emitted from the light emitting elements LD into the light of the second color, for example, light of a green color. In case that the pixel PXL is a blue pixel (or blue sub-pixel), the color conversion layer CCL of the corresponding pixel PXL may include the color conversion particles QD of blue quantum dots that convert the light of the first color emitted from the light emitting elements LD into the light of the second color, for example, light of a blue color. In some embodiments, in case that the pixel PXL is a blue pixel (or a blue sub-pixel), a light scattering layer including light scattering particles SCT may be provided instead of the color conversion layer CCL including the color conversion particles QD. For example, in case that the light emitting elements LD emit blue light, the pixel PXL may include the light scattering layer including the light scattering particles SCT. The above-described light scattering layer may be omitted according to embodiments. According to another embodiment, in case that the pixel PXL is the blue pixel (or blue sub-pixel), a transparent polymer may be provided instead of the color conversion layer CCL.

A capping layer CPL may be provided and/or formed on the color conversion layer CCL and the dummy bank D_BNK.

The capping layer CPL may be entirely provided in the pixel area PXA, and may be directly disposed on the dummy bank D_BNK and the color conversion layer CCL. The capping layer CPL may be an inorganic film (or an inorganic insulating film) including an inorganic material, and the capping layer CPL may include at least one of metal oxides such as a silicon nitride ($SiN_x$), a silicon oxide ($SiO_x$), a silicon oxynitride ($SiO_xN_y$), and an aluminum oxide ($AlO_x$). The capping layer CPL may be positioned on the color conversion layer CCL to cover the color conversion layer CCL to protect the color conversion layer CCL.

In some embodiments, the capping layer CPL may have a flat surface while alleviating a step caused by constituent elements disposed thereunder. For example, the capping layer CPL may include an organic film including an organic material. The capping layer CPL may be a common layer commonly provided in the display area DA including the pixel area PXA, but is not limited thereto.

A color filter CF and a light blocking pattern LBP may be provided and/or formed on the capping layer CPL.

The color filter CF may selectively transmit light of a specific color. The color filter CF may form the light conversion pattern LCP together with the color conversion layer CCL, and may include a color filter material that selectively transmits light of a specific color converted by the color conversion layer CCL. The color filter CF may include a red color filter, a green color filter, and a blue color filter. The above-described color filter CF may be disposed on a surface of the capping layer CPL to correspond to the color conversion layer CCL.

The light conversion pattern LCP including the color conversion layer CCL and the color filter CF may correspond to the emission area EMA of the pixel PXL.

The light blocking pattern LBP may be positioned on a surface of the capping layer CPL adjacent to the color filter CF. For example, the light blocking pattern LBP may be positioned on a surface of the capping layer CPL to correspond to the non-emission area NEMA. The light blocking pattern LBP may correspond to the dam portion DAM. The light blocking pattern LBP may include a light blocking material preventing light leakage defects in which light leaks between the pixel PXL and the adjacent pixels PXL. For example, the light blocking pattern LBP may include a black matrix. The light blocking pattern LBP may prevent a mixture of light respectively emitted from the adjacent pixels PXL.

The light blocking pattern LBP may be provided in a form of a multilayer (or multifilm) in which at least two or more color filters that selectively transmit light of different colors overlap each other. For example, the light blocking pattern LBP may be provided to include a red color filter, a green color filter disposed on the red color filter and overlapping the red color filter, and a blue color filter disposed on the green color filter and overlapping the green color filter. For example, the light blocking pattern LBP may be provided to have a structure in which a red color filter, a green color filter, and a blue color filter are sequentially stacked on each other. The red color filter, the green color filter, and the blue color filter may be used as the light blocking pattern LBP for blocking light transmission, in the non-emission area NEMA of the pixel area PXA.

A cover layer CVL may be provided and/or formed on the light blocking pattern LBP and the color filter CF.

The cover layer CVL may be an inorganic film (or an inorganic insulating film) including an inorganic material or an organic film (or an organic insulating film) including an organic material. The cover layer CVL may block inflow of water or moisture from the outside to the light emitting elements LD and the light conversion pattern LCP by entirely covering the components positioned thereunder. In an embodiment, the cover layer CVL may be an organic film entirely provided in the display area DA including the pixel area PXA by an inkjet printing method.

The display device according to the above-described embodiment may improve light emission efficiency by disposing the light conversion pattern LCP on the light emitting element LD to emit light having excellent color reproducibility through the light conversion pattern LCP.

In the above-described embodiment, it has been described that the color conversion layer CCL may be directly formed on the coating layer CTL, but the disclosure is not limited thereto. In some embodiments, the color conversion layer CCL may be formed on a surface of an upper substrate including a base layer BSL as shown in FIG. 10 to be combined with the display element layer DPL through an intermediate layer IML.

The intermediate layer IML may be a transparent adhesive layer (or bonding layer) for reinforcing adherence between the display element layer DPL and the upper substrate, for example, an optically clear adhesive layer, but is not limited thereto. In some embodiments, the intermediate layer IML may be a refractive index conversion layer for improving light emitting luminance of the pixel PXL by converting refractive index of light emitted from the light emitting elements LD and proceeding to the upper substrate.

In an embodiment, the intermediate layer IML may be disposed on the first and second patterns MAP1 and MAP2, the bank BNK, and the coating layer CTL.

The upper substrate may configure an encapsulation substrate and/or a window member of the display device. The upper substrate may include the base layer BSL (or base substrate), the light conversion pattern LCP, the light blocking pattern LBP, and first and second capping layers CPL1 and CPL2. The dummy bank D_BNK on the bank BNK may be selectively provided. For example, in case that the upper substrate is disposed on the display element layer DPL, the dummy bank D_BNK may be omitted.

The base layer BSL may be a rigid substrate or a flexible substrate, and its material or physical properties are not particularly limited. The base layer BSL may be made of the same material as the substrate SUB, or may be made of a material different from the substrate SUB.

In FIG. 10, the light conversion pattern LCP may be disposed on a surface of the base layer BSL to face the light emitting elements LD and the coating layer CTL. The light conversion pattern LCP may include the color conversion layer CCL and the color filter CF. The color filter CF may be disposed on a surface of the base layer BSL to correspond to the color conversion layer CCL.

The first capping layer CPL1 may be provided and/or formed between the color filter CF and the color conversion layer CCL.

The first capping layer CPL1 may be positioned on the color filter CF to cover the color filter CF, thereby protecting the color filter CF. The first capping layer CPL1 may be inorganic films containing inorganic materials or organic films containing organic materials.

The light blocking pattern LBP may be positioned adjacent to the light conversion pattern LCP. The light blocking pattern LBP may be disposed on a surface of the base layer BSL to correspond to the non-emission area NEMA of the pixel PXL. The light blocking pattern LBP may include a first light blocking pattern LBP1 and a second light blocking pattern LBP2.

The first light blocking pattern LBP1 may be positioned on a surface of the base layer BSL and may be positioned adjacent to the color filter CF. The first light blocking pattern LBP1 may have the same configuration as the light blocking pattern LBP described with reference to FIG. 9.

The first capping layer CPL1 may be provided and/or formed on the first light blocking pattern LBP1.

The second light blocking pattern LBP2 may be provided and/or formed on a surface of the first capping layer CPL1 to correspond to the first light blocking pattern LBP1. The second light blocking pattern LBP2 may be a black matrix. The first light blocking pattern LBP1 and the second light blocking pattern LBP2 may include the same material. In an embodiment, the second light blocking pattern LBP2 may be a structure that finally defines the emission area EMA of the pixel PXL. The second light blocking pattern LBP2 may be a dam structure that finally defines the emission area EMA to which the color conversion layer CCL should be supplied in a process of supplying the color conversion layer CCL.

The second capping layer CPL2 may be entirely provided and/or formed on the color conversion layer CCL and the second light blocking pattern LBP2.

The second capping layer CPL2 may include at least one of metal oxides such as a silicon nitride ($SiN_x$), a silicon oxide ($SiO_x$), a silicon oxynitride ($SiO_xN_y$), and an aluminum oxide ($AlO_x$), but is not limited thereto. In some embodiments, the second capping layer CPL2 may be configured of an organic film (or organic insulating film) including an organic material. The second capping layer CPL2 is positioned on the color conversion layer CCL to protect the color conversion layer CCL from external moisture, thereby further improving reliability of the color conversion layer CCL.

The above-described upper substrate may be positioned on the intermediate layer IML to be combined with the display element layer DPL.

According to the above-described embodiment, the coating layer CTL may be positioned between the light emitting elements LD and the color conversion layer CCL in the emission area EMA, so that a gap between the light emitting elements LD and the color conversion layer CCL may be further secured as much as a thickness of the coating layer CTL. As the light emitting elements LD and the color conversion layer CCL may be spaced apart from each other (or as the gap between the light emitting elements LD and the color conversion layer CCL may be further secured), it may be possible to reduce or minimize direct transmission of heat generated from the light emitting elements LD to the color conversion layer CCL, thereby preventing deterioration of the color conversion layer CCL due to the heat.

Accordingly, reliability of the color conversion layer CCL may be improved, and light output efficiency may be improved in the pixel PXL.

According to the above-described embodiment, by forming the first pixel electrode PE1 and the second pixel electrode PE2 in the same process, compared with a case in which the first pixel electrode PE1 and the second pixel electrode PE2 are formed in separate processes, a display device having a relatively simple manufacturing process while reducing manufacturing costs by reducing the number of masks may be provided.

FIG. 11 to FIG. 23 illustrate cross-sectional views for schematically explaining a manufacturing method of the display element layer DPL of the pixel PXL of FIG. 7, and FIG. 24 illustrates a schematic cross-sectional view of the manufacturing method of the display element layer DPL of FIG. 23 according to another embodiment.

Hereinafter, the display element layer DPL of the pixel PXL according to an embodiment shown in FIG. 7 will be sequentially described according to a manufacturing method with reference to FIG. 11 to FIG. 24.

In the specification, although manufacturing steps of the pixel PXL are described as being sequentially performed according to the cross-sectional views, it is obvious that some steps shown as being continuously performed may be simultaneously performed, the order of respective steps may be changed, some steps may be omitted, or another step may be added between respective steps.

In FIG. 11 to FIG. 24, differences from the above-described embodiment will be described in order to avoid duplicate descriptions.

Referring to FIG. 5 to FIG. 7 and FIG. 11, the pixel circuit layer PCL may be formed on the substrate SUB. The first bank pattern BNKP1 and the second bank pattern BNKP2 spaced apart from each other may be formed on the via layer VIA of the pixel circuit layer PCL.

Referring to FIGS. 5 to 7, FIG. 11, and FIG. 12, the first alignment electrode ALE1 may be formed on the first bank pattern BNKP1, and the second alignment electrode ALE2 may be formed on the second bank pattern BNKP2.

The first alignment electrode ALE1 and the second alignment electrode ALE2 may be formed by the same process, may be disposed on the same layer, and may include the same material.

Referring to FIG. 5 to FIG. 7 and FIG. 11 to FIG. 13, the first insulating layer INS1 may be formed on the first and second alignment electrodes ALE1 and ALE2 and the via layer VIA. The first insulating layer INS1 may be partially opened to expose an area of the first alignment electrode ALE1 and an area of the second alignment electrode ALE2. The first insulating layer INS1 may be an inorganic film (or an inorganic insulating film) including an inorganic material.

Referring to FIG. 5 to FIG. 7 and FIG. 11 to FIG. 14, the bank BNK may be formed on the first insulating layer INS1. The bank BNK may be formed on the first insulating layer INS1 in the non-emission area NEMA.

Referring to FIG. 5 to FIG. 7 and FIG. 11 to FIG. 15, an electric field may be formed between the first alignment electrode ALE1 and the second alignment electrode ALE2 by applying a corresponding alignment signal to each of the first and second alignment electrodes ALE1 and ALE2.

In the state in which the electric field may be formed, the ink including the light emitting elements LD may be injected into the pixel area PXA of the pixel PXL by using an inkjet printing method. For example, at least one inkjet nozzle may be disposed on the second insulating layer INS2, and ink mixed with the light emitting elements LD may be injected into the pixel area PXA of the pixel PXL through the inkjet nozzles. The method of injecting the light emitting elements LD into the pixel area PXA is not limited to the above-described embodiment, and the method of injecting the light emitting elements LD may be variously changed.

In case that the light emitting elements LD are injected into the pixel area PXA, self-alignment of the light emitting elements LD may be induced on the first insulating layer INS1 between the first alignment electrode ALE1 and the second alignment electrode ALE2.

After the light emitting elements LD are self-aligned, the solvent contained in the ink may be evaporated, or removed in some other way.

Referring to FIG. 5 to FIG. 7 and FIG. 11 to FIG. 16, a first material layer MAL1 (or a first insulating material layer) may be entirely formed on the bank BNK and the light emitting elements LD. The first material layer MAL1 may be entirely applied (or coated) on the bank BNK and the light emitting elements LD in a liquid form having viscosity. The first material layer MAL1 may be configured of an organic film having a transparent insulating property, and may be cured through a curing process. In the curing process, the solvent remaining in the first material layer MAL1 may be removed.

Referring to FIG. 5 to FIG. 7 and FIG. 11 to FIG. 17, a second material layer MAL2 (or a second insulating material layer) may be formed on the cured first material layer MAL1. The second material layer MAL2 may be an inorganic film (or an inorganic insulating film) containing an inorganic material.

Referring to FIG. 5 to FIG. 7 and FIG. 11 to FIG. 18, after a photoresist layer may be applied on the second material layer MAL2, a photolithography process using a mask is performed to form the first pattern MAP1 and the second pattern MAP2. The first pattern MAP1 and the second pattern MAP2 may have constituent elements in which a portion of the second material layer MAL2 is removed in the above-described process and remains on the second material layer MAL2 in the form of individual patterns. As a portion of the second material layer MAL2 may be removed due to the above-described process, an area of the first material layer MAL1 positioned thereunder the second material layer MAL1 may be exposed to the outside.

Referring to FIG. 5 to FIG. 7 and FIG. 11 to FIG. 19, a dry ashing process using the first and second patterns MAP1 and MAP2 as a mask may be performed to selectively remove the first material layer MAL1 to form the second insulating layer INS2.

The second insulating layer INS2 may be positioned on each light emitting element LD in the emission area EMA to cover at least a portion of a surface (for example, the upper surface in the third direction DR3) of the corresponding light emitting element LD to expose the first and second ends EP1 and EP2 except for the active layer 12 of the corresponding light emitting element LD to the outside. The second insulating layer INS2 fixes the light emitting elements LD to prevent the light emitting elements LD from deviating from the aligned position. In an embodiment, the second insulating layer INS2 may be positioned between each light emitting element LD and the first pattern MAP1 in the third direction DR3. In the emission area EMA, the second insulating layer INS2 may include the first surface SF1 (or the lower surface) contacting a surface of each light emitting element LD, and the second surface SF2 (or the upper surface) facing the first surface SF1 in the third direction DR3 and contacting the first pattern MAP1.

The second insulating layer INS2 may be positioned on the bank BNK in the at least non-emission area NEMA. In an embodiment, the second insulating layer INS2 may be positioned between the bank BNK and the second pattern MAP2 in the third direction DR3.

In case that the process of forming the second insulating layer INS2 is performed so that the pixel PXL may be driven independently or separately from the pixels PXL adjacent thereto, a portion of the first alignment electrode ALE1 may be removed from the second opening OP2 of the bank BNK, which may be an electrode separation area. Accordingly, the first alignment electrode ALE1 may be electrically and/or physically separated from the first alignment electrode ALE1 provided in adjacent pixels PXL positioned in the same pixel column.

Referring to FIG. 5 to FIG. 7 and FIG. 11 to FIG. 20, the conductive layer CL may be entirely applied on the first and second patterns MAP1 and MAP2, an area of the bank BNK, an area of the first insulating layer INS1, and an area of the second insulating layer INS2. The conductive layer CL may be made of various transparent conducting materials. For example, the conductive layer CL may be made of a transparent conductive oxide.

Referring to FIG. 5 to FIG. 7 and FIG. 11 to FIG. 21, a third material layer MAL3 (or a third insulating material layer) may be entirely applied (or coated) on the conductive layer CL. The third material layer MAL3 may be configured of an organic film (or an organic insulating film) containing an organic material to have a thickness of a level or more. Accordingly, the third material layer MAL3 may sufficiently cover the first pattern MAP1 on the second insulating layer INS2 in the emission area EMA.

Referring to FIG. 5 to FIG. 7 and FIG. 11 to FIG. 22, after applying the photoresist layer on the third material layer MAL3, a photolithography process using a mask may be performed to remove a portion of the third material layer MAL3 to form the coating layer CTL.

The coating layer CTL may be positioned in the emission area EMA surrounded by the bank BNK, and may expose an area of the conductive layer CL and cover the conductive layer CL in the remaining area except for the area.

Referring to FIG. 5 to FIG. 7 and FIG. 11 to FIG. 23, an etching process may be performed to remove an area of the conductive layer CL exposed to the outside to form the electrically separated first and second pixel electrodes PE1 and PE2. A method of removing an area of the conductive layer CL may include a wet etching method.

The coating layer CTL having the flat surface UF may be finally formed by performing a curing process after performing the above-described etching process. The coating layer CTL may be used as a planarization layer to alleviate a step caused by the components positioned thereunder. The coating layer CTL may be positioned between the light emitting elements LD and the color conversion layer CCL to further secure a gap between the light emitting elements LD and the color conversion layer CCL to reduce or prevent the transmission of heat generated by the light emitting elements LD to the color conversion layer CCL.

In some embodiments, by performing a dry etching process after the curing process, as shown in FIG. 24, the first and second patterns MAP1 and MAP2 may be removed. The second surface SF2 of the second insulating layer INS2 of the emission area EMA and a surface (or the upper surface) of the second insulating layer INS2 of the non-emission area NEMA may be exposed, respectively.

As the first pixel electrode PE1 electrically connected to the first end EP1 of each light emitting element LD and the second pixel electrode PE2 electrically connected to the second end EP2 of the corresponding light emitting element LD may be simultaneously formed in the same process, in an embodiment, the number of masks may be reduced compared with the case in which the first pixel electrode PE1 and the second pixel electrode PE2 may be respectively formed by separate processes. Accordingly, in the above-described embodiments, the manufacturing process of the display device may be simplified, and the manufacturing cost may be reduced.

After the process of forming the first pixel electrode PE1 and the second pixel electrode PE2, the color conversion layer CCL may be directly formed on the coating layer CTL, so that the surface UF of the coating layer CTL and the color conversion layer CCL may directly contact each other.

While the disclosure has been shown and described with reference to certain embodiments thereof, it will be understood by those skilled in the art that various changes in forms and details may be made therein without departing from the scope of the disclosure.

What is claimed is:

1. A display device comprising:
a pixel disposed in a display area of a substrate and including an emission area and a non-emission area, the pixel including:
a light emitting element disposed in the emission area and including a first end and a second end facing each other in an extending direction of the light emitting element;
a first pixel electrode electrically connected to the first end of the light emitting element;
a second pixel electrode electrically connected to the second end of the light emitting element;
an insulating pattern disposed on the light emitting element to expose the first and second ends, the insulating pattern including:
a first surface contacting a top surface of the light emitting element facing away from the substrate; and
a second surface facing away from the light emitting element;
a first pattern contacting the second surface of the insulating pattern; and
a coating layer disposed on the first and second pixel electrodes and including a flat surface,
wherein the coating layer does not contact the insulating pattern and does not contact the first pattern.

2. The display device of claim 1, wherein the coating layer includes an organic film.

3. The display device of claim 2, wherein the coating layer includes at least one of acryl, polyimide, and siloxane.

4. The display device of claim 2, wherein each of the first and second pixel electrodes contacts a side surface of the insulating pattern.

5. The display device of claim 4, wherein a surface of the coating layer and at least one area of each of the first and second pixel electrodes are colinear.

6. The display device of claim 4, wherein
the first pixel electrode and the second pixel electrode are provided on a same layer,
the first pixel electrode and the second pixel electrode include a same material, and
the first pixel electrode and the second pixel electrode are spaced apart from each other on the insulating pattern.

7. The display device of claim 4, wherein the coating layer is positioned in the emission area.

8. The display device of claim 2, wherein
the pixel is positioned on the second surface of the insulating pattern.

9. The display device of claim 8, wherein the first pattern does not contact the coating layer.

10. The display device of claim 9, wherein the insulating pattern is surrounded by the first pattern, the first and second pixel electrodes, and the light emitting element.

11. The display device of claim 8, wherein the pixel further includes:
a bank that is positioned in the non-emission area and includes:
a first opening corresponding to the emission area; and
a second opening spaced apart from the first opening; and a second pattern disposed on the bank.

12. The display device of claim 11, wherein the first pattern and the second pattern include a same material.

13. The display device of claim 11, wherein the pixel further includes:
a light conversion pattern positioned on the coating layer to correspond to the emission area; and
a light blocking pattern positioned on the bank in the non-emission area.

14. The display device of claim 13, wherein the light conversion pattern includes:
a color conversion layer positioned on the coating layer and converting light of a first color emitted from the light emitting element into light of a second color; and
a color filter positioned on the color conversion layer to correspond to the color conversion layer.

15. The display device of claim 14, wherein the coating layer is disposed between the light emitting element and the color conversion layer in a thickness direction of the substrate.

16. The display device of claim 11, wherein the pixel further includes:
a pixel circuit layer including at least one transistor and at least one power wire electrically connected to the light emitting element;
a first bank pattern and a second bank pattern that are disposed on the pixel circuit layer and spaced apart from each other at least in the emission area;
a first alignment electrode positioned on the first bank pattern and electrically connected to the transistor; and
a second alignment electrode positioned on the second bank pattern and electrically connected to the power wire.

17. A display device comprising:
a pixel disposed in a display area of a substrate and including an emission area and a non-emission area, the pixel including:
at least one transistor and at least one power wire that are disposed on the substrate;
a via layer disposed on the transistor and the power wire;
a first alignment electrode and a second alignment electrode that are disposed on the via layer and spaced apart from each other;
an insulating layer disposed on the first and second alignment electrodes;
a light emitting element disposed on the insulating layer between the first alignment electrode and the second alignment electrode and including a first end and a second end in an extending direction;
an insulating pattern positioned at an upper portion of the light emitting element facing away from the substrate;
a first pixel electrode electrically connected to the first alignment electrode and the first end of the light emitting element;

a second pixel electrode electrically connected to the second alignment electrode and the second end of the light emitting element;

a first pattern contacting an upper surface of the insulating pattern facing away from the light emitting element;

a coating layer positioned on the first and second pixel electrodes and having a flat surface; and a color conversion layer disposed on the coating layer and in the emission area to correspond to the light emitting element, wherein the coating layer does not contact the insulating pattern, does not contact the first pattern, and includes an organic film.

18. A manufacturing method of a display device, comprising:

forming at least one pixel including an emission area and a non-emission area on a substrate, the forming of the at least one pixel including: forming a first alignment electrode and a second alignment electrode that are spaced apart from each other on the substrate;

forming a first insulating layer on the first and second alignment electrodes;

forming a bank on the first insulating layer to correspond to the non-emission area;

aligning a light emitting element on the first insulating layer between the first alignment electrode and the second alignment electrode;

sequentially applying a first material layer and a second material layer on the light emitting element, performing a photolithography process using a first mask to remove a portion of the second material layer to form a first pattern corresponding to the light emitting element and a second pattern corresponding to the bank, and partially exposing the first material layer;

performing a dry ashing process using the first and second patterns as a second mask to remove the exposed first material layer, and forming a second insulating layer positioned under the first and second patterns;

coating a conductive layer on the first and second patterns and the first insulating layer, and coating a third material layer on the conductive layer;

performing a photolithography process using a third mask to remove a portion of the third material layer to form a coating layer, and exposing a portion of the conductive layer; and removing a portion of the exposed conductive layer to form a first pixel electrode and a second pixel electrode that are spaced apart from each other, and exposing the first pattern on the second insulating layer.

19. The manufacturing method of the display device of claim 18, wherein the coating layer includes at least one of acryl, polyimide, and siloxane.

20. The manufacturing method of the display device of claim 18, wherein the forming of the at least one pixel further includes after the forming of the first pixel electrode and the second pixel electrode, forming a color conversion layer at an upper portion of the coating layer.

* * * * *